United States Patent
Kim et al.

(10) Patent No.: US 11,942,508 B2
(45) Date of Patent: Mar. 26, 2024

(54) PIXEL AND DISPLAY DEVICE INCLUDING THE SAME

(71) Applicant: Samsung Display Co., LTD., Yongin-si (KR)

(72) Inventors: Sung Hoon Kim, Yongin-si (KR); Yi Joon Ahn, Yongin-si (KR); Eun Kyung Yeon, Yongin-si (KR); Jae Been Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 333 days.

(21) Appl. No.: 17/307,436

(22) Filed: May 4, 2021

(65) Prior Publication Data

US 2022/0077225 A1 Mar. 10, 2022

(30) Foreign Application Priority Data

Sep. 4, 2020 (KR) .......................... 10-2020-0113390

(51) Int. Cl.
*H01L 27/15* (2006.01)
*H01L 33/38* (2010.01)

(52) U.S. Cl.
CPC .......... *H01L 27/156* (2013.01); *H01L 33/382* (2013.01)

(58) Field of Classification Search
CPC ..... H01L 27/156; H01L 33/382; H01L 33/62; H01L 25/0753; H01L 23/13;
(Continued)

(56) References Cited

U.S. PATENT DOCUMENTS 8,129,768 B2 3/2012 Shibata et al.
9,773,761 B2 9/2017 Do
(Continued)

FOREIGN PATENT DOCUMENTS

JP 5060740 10/2012
JP 2013-4792 1/2013
(Continued)

OTHER PUBLICATIONS

V. R. Bhardwaj et al., "Optically Produced Arrays of Planar Nanostructures inside Fused Silica", Physical Review Letters, Feb. 10, 2006, pp. 057404-1-057404-4.
(Continued)

*Primary Examiner* — David Vu
(74) *Attorney, Agent, or Firm* — KILE PARK REED & HOUTTEMAN PLLC

(57) ABSTRACT

A display device includes a pixel in a display area. The pixel includes a first electrode and a second electrode that are spaced apart from each other, a first insulating layer disposed on the first and second electrodes and including a trench corresponding to a region between the first and second electrodes, light emitting elements disposed in the trench, each of the light emitting elements including a first end portion and a second end portion, a first contact electrode disposed on the first end portion of each of the light emitting elements and the first electrode, and a second contact electrode disposed on the second end portion of each of the light emitting elements and the second electrode. The trench includes a first trench accommodating the light emitting elements, and second trenches disposed in the first trench.

20 Claims, 25 Drawing Sheets

(58) Field of Classification Search
CPC ............... H01L 23/485; H01L 23/5386; H01L 27/1463; H01L 27/14603–14616; H01L 27/124; H10K 59/123; H10K 59/805–80524
See application file for complete search history.

(56) References Cited

U.S. PATENT DOCUMENTS

| | | | |
|---|---|---|---|
| 2007/0146563 | A1 | 6/2007 | Yun et al. |
| 2020/0005703 | A1* | 1/2020 | Kim .................... G09G 3/32 |
| 2020/0111832 | A1 | 4/2020 | Yang et al. |

FOREIGN PATENT DOCUMENTS

| | | |
|---|---|---|
| KR | 10-2006-0075586 | 7/2006 |
| KR | 10-0634755 | 10/2006 |
| KR | 10-2007-0063172 | 6/2007 |
| KR | 10-1490758 | 2/2015 |
| KR | 10-1609376 | 4/2016 |
| KR | 10-2020-0021574 | 3/2020 |
| KR | 10-2020-0040352 | 4/2020 |
| KR | 10-2020-0077671 | 7/2020 |
| KR | 10-2020-0086790 | 7/2020 |

OTHER PUBLICATIONS

International Search Report corresponding to International Application No. PCT/KR2021/010069 dated Nov. 18, 2021.

* cited by examiner

PIXEL AND DISPLAY DEVICE INCLUDING THE SAME

CROSS-REFERENCE TO RELATED APPLICATION(S)

This application claims priority to and benefits of Korean Patent Application No. 10-2020-0113390 under 35 U.S.C. § 119, filed on Sep. 4, 2020, in the Korean Intellectual Property Office, the entire contents of which are incorporated herein by reference.

BACKGROUND

1. Field

The embodiments of the disclosure relate to a pixel and a display device including the same.

2. Description of the Related Art

Recently, interest in information displays is increasing. Accordingly, research and development of display devices have been continuously conducted.

SUMMARY

The embodiments provide a pixel including a light emitting element and a display device including the pixel.

Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

A display device according to an embodiment may include a pixel disposed in a display area. The pixel may include a first electrode and a second electrode that are spaced apart from each other, a first insulating layer disposed on the first electrode and the second electrode and including a trench corresponding to a region between the first electrode and the second electrode, light emitting elements disposed in the trench and each of the light emitting elements including a first end portion and a second end portion, a first contact electrode disposed on the first end portion of each of the light emitting elements and the first electrode, and a second contact electrode disposed on the second end portion of each of the light emitting elements and the second electrode. The trench may include a first trench that accommodates the light emitting elements, and second trenches disposed in the first trench.

In an embodiment, the second trenches may be disposed on a bottom surface of the first trench to form an uneven surface on the bottom surface of the first trench.

In an embodiment, the first electrode, the first trench, and the second electrode may be sequentially disposed in a first direction, and each of the first electrode, the first trench, and the second electrode may extend in a second direction intersecting the first direction.

In an embodiment, the first trench may have a width equal to or greater than a length of each of the light emitting elements in the first direction.

In an embodiment, each of the second trenches may extend in the first direction, and the second trenches may be sequentially disposed in the second direction.

In an embodiment, each of the second trenches may have a length equal to or greater than the length of each of the light emitting elements in the first direction.

In an embodiment, each of the second trenches may have a width equal to or less than a diameter of each of the light emitting elements in the second direction, and at least one of the light emitting elements may be partially inserted in at least one of the second trenches.

In an embodiment, each the second trenches may have a width equal to or greater than a diameter of each of the light emitting elements in the second direction, and at least one of the light emitting elements may be accommodated in at least one of the second trenches.

In an embodiment, each of the second trenches may extend in the second direction, and the second trenches may be sequentially disposed in the first direction.

In an embodiment, each of the second trenches may have a dot shape, and the second trenches may be dispersed on a bottom surface of the first trench.

In an embodiment, each of the second trenches may have a depth equal to or less than a diameter of each of the light emitting elements.

In an embodiment, the first electrode may have a circular or polygonal shape, and the second electrode and the trench may have a circular ring or polygonal ring shape concentric with the first electrode.

In an embodiment, the first contact electrode may electrically connect the first end portion of each of the light emitting elements to the first electrode, and the second contact electrode may electrically connect the second end portion of each of the light emitting elements to the second electrode.

In an embodiment, the pixel may further include a first bank pattern portion disposed under the first electrode and overlapping a region of the first electrode, and a second bank pattern portion disposed under the second electrode and overlapping a region of the second electrode.

In an embodiment, the trench may be positioned in a region between the first and second bank pattern portions and does not to overlap the first bank pattern portion and second bank pattern portion.

A pixel according to an embodiment may include a first electrode and a second electrode that are spaced apart from each other, a first insulating layer disposed on the first electrode and second electrode and including a trench corresponding to a region between the first electrode and second electrode, light emitting elements disposed in the trench, and each light emitting element including a first end portion and a second end portion, a first contact electrode disposed on the first end portion of each of the light emitting elements and the first electrode, and a second contact electrode disposed on the second end portion of each of the light emitting elements and the second electrode. The trench includes a first trench that accommodates the light emitting elements, and second trenches disposed in the first trench.

In an embodiment, the second trenches may be disposed on a bottom surface of the first trench to form an uneven surface on the bottom surface of the first trench.

In an embodiment, each of the second trenches may have a depth equal to or less than a diameter of each of the light emitting elements.

In an embodiment, the pixel may further include a first bank pattern portion disposed under the first electrode and overlapping a region of the first electrode, and a second bank pattern portion disposed under the second electrode and overlapping a region of the second electrode.

In an embodiment, the trench may be positioned in a region between the first and second bank pattern portions and does not to overlap the first bank pattern portion and the second bank pattern portion.

Details of other embodiments are included in the detailed description and drawings.

According to embodiments, an alignment position and/or a direction of the light emitting elements may be controlled. For example, eccentric alignment of the light emitting elements may be prevented while biasing and aligning the light emitting elements according to a desired direction. Accordingly, the first and second end portions of the light emitting elements may be stably connected to the first and second contact electrodes, respectively. According to the embodiments, the utilization rate of the light emitting elements supplied to each pixel area may be increased and a light emission characteristic of the pixel may be improved.

An effect according to the embodiments are not limited by the contents illustrated above, and more various effects are included in the disclosure.

BRIEF DESCRIPTION OF THE DRAWINGS

The above and other features of the embodiments will become more apparent by describing them in further detail with reference to the accompanying drawings, in which.

DETAILED DESCRIPTION OF THE EMBODIMENTS

Figure 1:
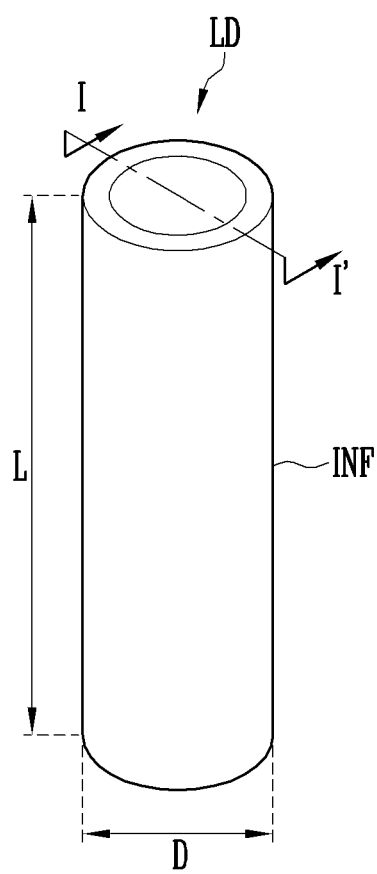
FIG. 1 is a schematic perspective view illustrating a light emitting element according to an embodiment.

The embodiments may be modified in various ways and may have various forms, and specific embodiments will be illustrated in the drawings and described in detail herein. In the following description, the singular forms also include the plural forms unless the context clearly includes the singular.

The embodiments are not limited to the embodiments disclosed below, and may be modified in various forms and may be implemented. Each of the embodiments disclosed below may be implemented alone or in combination with at least one of other embodiments.

In the drawings, some components which are not directly related to a characteristic of the embodiments may be omitted to clearly represent the embodiments. Some components in the drawings may be shown to be exaggerated in size or proportion. Throughout the drawings, the same or similar components will be given by the same reference numerals and symbols as much as possible even though they are shown in different drawings, and repetitive descriptions will be omitted.

Figure 2:
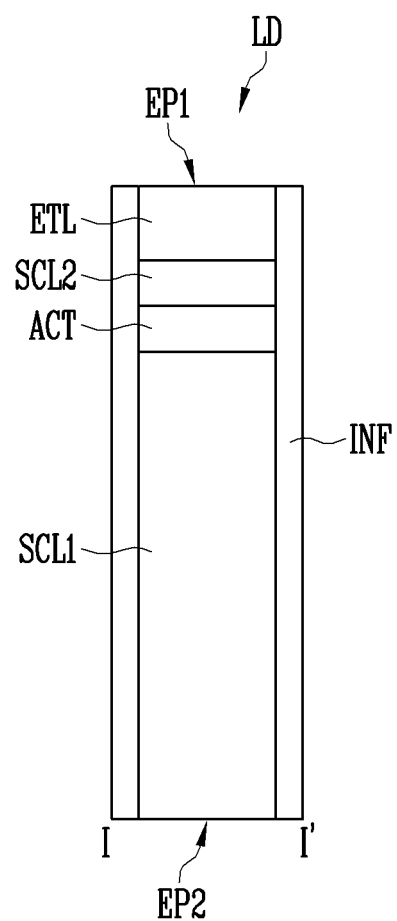
FIG. 2 is a schematic cross-sectional view illustrating the light emitting element according to an embodiment.

FIG. 1 is a schematic perspective view illustrating a light emitting element LD according to an embodiment, FIG. 2 is a cross-sectional view illustrating the light emitting element LD according to an embodiment. For example, FIG. 1 illustrates an example of the light emitting element LD that may be used as a light source of a pixel according to an embodiment, and FIG. 2 illustrates an example of a cross-section of the light emitting element LD taken along line I~I' of FIG. 1.

Referring to FIGS. 1 and 2, the light emitting element LD includes a first semiconductor layer SCL1, an active layer ACT, and a second semiconductor layer SCL2, which are sequentially disposed along one direction, and an insulating film INF surrounding an outer circumferential surface (for example, a side surface) of the first semiconductor layer SCL1, the active layer ACT, and the second semiconductor layer SCL2. The light emitting element LD may also include an electrode layer ETL disposed on the second semiconductor layer SCL2. The insulating film INF may or may not at least partially surround an outer circumferential surface of the electrode layer ETL. According to an embodiment, the light emitting element LD may further include another electrode layer disposed on a surface (for example, a lower surface) of the first semiconductor layer SCL1.

In an embodiment, the light emitting element LD may be provided in a stick (or rod) shape extending along one direction, and may have a first end portion EP1 and a second end portion EP2 at the ends of a length L direction (or a thickness direction). The first end portion EP1 may be a first bottom surface (or an upper surface) of the light emitting element LD, and the second end portion EP2 may be a second bottom surface (or a lower surface) of the light emitting element LD.

In an embodiment, the term "rod shape" includes rod-like shapes and bar-like shapes that are long (have an aspect ratio greater than 1) in the length L direction, and may include circular columns or polygonal columns without limitation to the shape of the cross section thereof. For example, the length L of the light emitting element LD may be greater than the diameter D (or the width of the cross section).

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. For example, the first semiconductor layer SCL1 may be disposed on the second end portion EP2 of the light emitting element LD, and the electrode layer ETL may be disposed on the first end portion EP1 of the light emitting element LD. In an embodiment, at least one electrode layer may be disposed on the second end portion EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any one semiconductor material among InAlGaN, GaN, AlGaN, InGaN, AlN, and InN, and may be an N-type semiconductor layer doped with a dopant such as Si, Ge, or Sn. However, the material comprising the first semiconductor layer SCL1 is not limited thereto, and other materials may also comprise the first semiconductor layer SCL1.

The active layer ACT may be disposed on the first semiconductor layer SCL1 and may be formed in a single-quantum well or multi-quantum well structure. A position of the active layer ACT may be changed according to a type of the light emitting element LD. The active layer ACT may emit light having a wavelength of about 400 nm to about 900 nm, and may use a double hetero-structure.

A clad layer (not shown) doped with a conductive dopant may be selectively formed on and/or under the active layer ACT. For example, the clad layer may be formed of an AlGaN layer or an InAlGaN layer. According to an embodiment, a material such as AlGaN or AlInGaN may be used to form the active layer ACT, and other materials may also comprise the active layer ACT.

When a voltage equal to or greater than a threshold voltage is applied to both ends of the light emitting element LD, the light emitting element LD emits light while electron-hole pairs are combined in the active layer ACT. By controlling light emission of the light emitting element LD using such a principle, the light emitting element LD may be used as a light source of light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN, and may be a P-type semiconductor layer doped with a dopant such as Mg. However, the material comprising the second semiconductor layer SCL2 is not limited thereto, and other materials may also comprise the second semiconductor layer SCL2.

In an embodiment, the first semiconductor layer SCL1 and the second semiconductor layer SCL2 may have different lengths (or thicknesses) in the length L direction of the light emitting element LD. For example, the first semiconductor layer SCL1 may have a length (or a thickness) longer (or thicker) than that of the second semiconductor layer SCL2 along the length L direction of the light emitting element LD. Accordingly, the active layer ACT of the light emitting element LD may be positioned closer to the first end portion EP1 than the second end portion EP2.

The electrode layer ETL may be disposed on the second semiconductor layer SCL2. The electrode layer ETL may protect the second semiconductor layer SCL2, and may be a contact electrode for smoothly connecting the second semiconductor layer SCL2 to a predetermined electrode, line, or the like. For example, the electrode layer ETL may be an ohmic contact electrode or a Schottky contact electrode.

In describing embodiments, the term "connection (or access)" may mean a physical and/or electrical connection (or access) generically. This may mean a direct or indirect connection (or access) and an integral or non-integral connection (or access) generically.

The electrode layer ETL may be substantially transparent or translucent. Accordingly, light generated by the light emitting element LD may pass through the electrode layer ETL and may be emitted to the outside of the light emitting element LD. In other embodiments, the electrode layer ETL may be opaque when the light generated by the light emitting element LD does not pass through the electrode layer ETL and the light is emitted to the outside through a region other than the end portion of the light emitting element LD on which the electrode layer ETL is disposed.

In an embodiment, the electrode layer ETL may include metal or metal oxide. For example, the electrode layer ETL may be formed using a metal such as chromium (Cr), titanium (Ti), aluminum (Al), gold (Au), nickel (Ni), or copper (Cu), an oxide or alloy of these metals, a transparent conductive material such as indium tin oxide (ITO), indium zinc oxide (IZO), indium tin zinc oxide (ITZO), zinc oxide (ZnO), or indium oxide ($In_2O_3$), and the like, either alone or in a combination.

The insulating film INF may expose the electrode layer ETL and the first semiconductor layer SCL1 at the first and second end portions EP1 and EP2 of the light emitting element LD, respectively.

When the insulating film INF is provided to cover the surface of the light emitting element LD, particularly the outer circumferential surface of the first semiconductor layer SCL1, the active layer ACT, the second semiconductor layer SCL2, and/or the electrode layer ETL, short circuit defects through the light emitting element LD may be prevented. Accordingly, electrical stability of the light emitting element LD may be assured.

When the insulating film INF is provided on the surface of the light emitting element LD, surface defects of the light emitting element LD may be minimized, and thus life and efficiency may be improved. When the insulating film INF is formed on each light emitting element LD, even though the light emitting elements LD are disposed close to each other, occurrence of unwanted short circuits between the light emitting elements LD may be prevented.

In an embodiment, the light emitting element LD may be manufactured through a surface treatment process. For example, the surface treatment may be performed on each light emitting element LD such that when the light emitting elements LD are mixed in a fluid solution (or solvent) and supplied to the light emitting areas of each pixel, the light emitting elements LD may be uniformly dispersed in the solution and avoid aggregating together. In an embodiment, the insulating film INF itself may be a hydrophobic film formed of a hydrophobic material, or a hydrophobic film may be additionally formed on the insulating film INF.

The insulating film INF may include a transparent insulating material. Accordingly, light generated in the active layer ACT may pass through the insulating film INF and may be emitted outside of the light emitting element LD. For example, the insulating film INF may include at least one insulating material of $SiO_2$ or other silicon oxide (SiOx), $Si_3N_4$ or other silicon nitride (SiNx), $Al_2O_3$ or other aluminum oxide ($Al_xO_y$), and $TiO_2$ or other titanium oxide ($Ti_xO_y$), but the embodiments are not limited thereto.

The insulating film INF may be formed of a single layer or multiple layers. For example, the insulating film INF may be formed of a double film.

The insulating film INF may be partially etched in at least one of the upper or lower region. The insulating film INF may have a rounded shape in the partially etched region, but the embodiments are not limited by the shape of the insulating film INF. For example, in at least one of the upper or the lower regions, the insulating film INF may be partially or entirely removed. Accordingly, some of the first semiconductor layer SCL1, the second semiconductor layer SCL2, the electrode layer ETL, or another electrode layers (for example, another electrode layer disposed at the second end portion EP2 of the light emitting element LD) may be exposed.

In an embodiment, the light emitting element LD may have a nanometer scale to micrometer scale size. For example, each light emitting element LD may have a diameter D (or a width of a cross section) and/or length L in the nanometer scale to micrometer scale range. For example, the light emitting element LD may have a diameter D in a range of several hundred nanometers and a length L in a range of several micrometers. However, the size of the light emitting element LD is not limited thereto. For example, the size of the light emitting element LD may be changed according to the design conditions of the light emitting devices using the light emitting element LD as a light source.

The structure, shape, and/or type of the light emitting element LD may be modified according to an embodiment. For example, the light emitting element LD may not include the electrode layer ETL. In other embodiments, the light emitting element LD may further include another electrode layer disposed at an end portion of the first semiconductor layer SCL1. For example, the light emitting element LD may further include at least one other electrode layer disposed on the second end portion EP2. The light emitting element LD may also be formed in a core-shell structure.

A light emitting device including the light emitting element LD may be used in a variety of devices that require a light source, including a display device. For example, multiple light emitting elements LD may be arranged in each pixel of a display panel, and the light emitting elements LD may be used as a light source of each pixel. However, the application field of the light emitting element LD is not limited to this example. For example, the light emitting element LD may also be used in other types of devices that require a light source, such as a lighting device.

Figure 3:
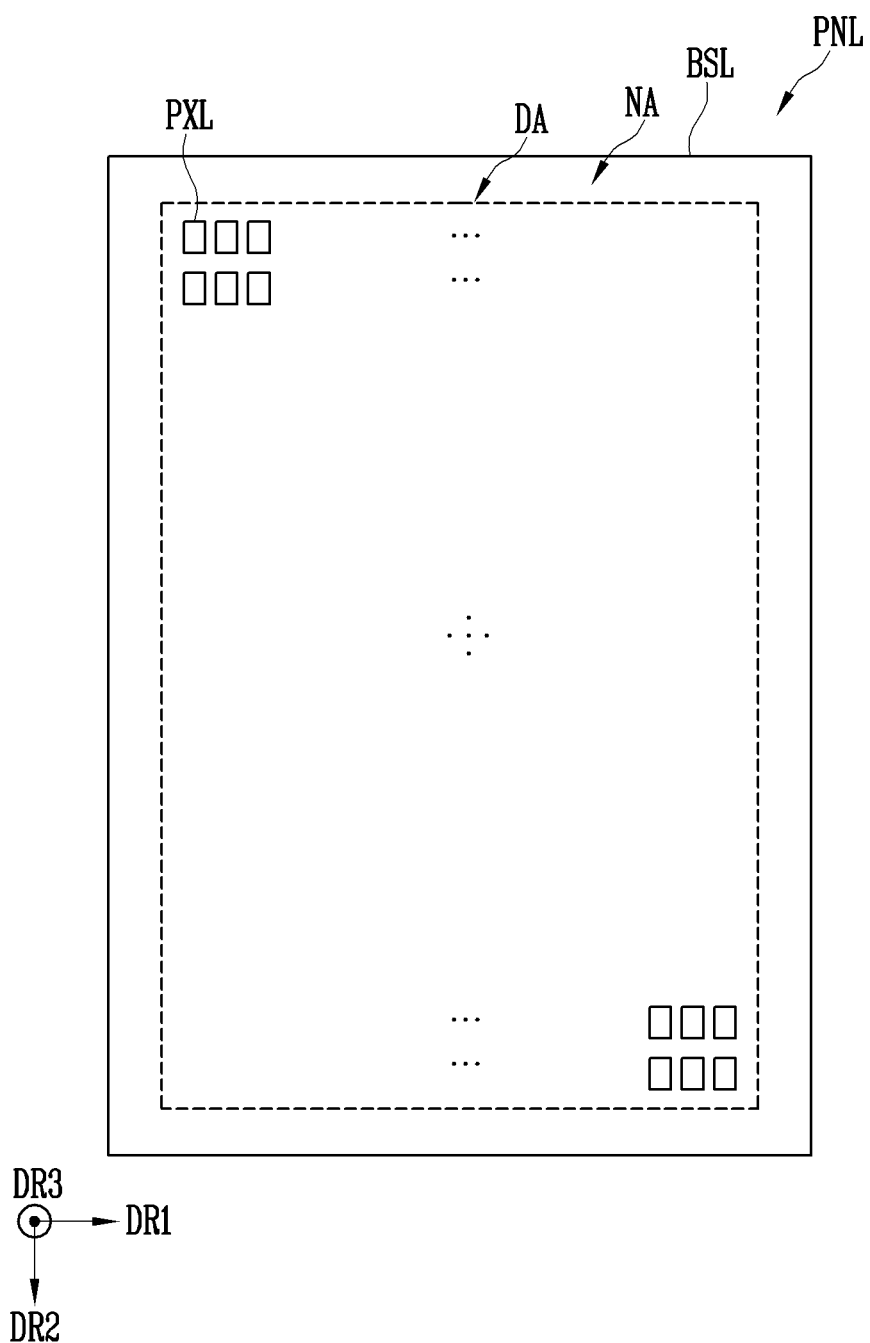
FIG. 3 is a schematic plan view illustrating a display device according to an embodiment.

FIG. 3 is a schematic plan view illustrating the display device according to an embodiment. For example, FIG. 3 shows a display panel PNL comprising a screen or the like of the display device. According to an embodiment, the display panel PNL of FIG. 3 may use the light emitting element LD described in the embodiment of FIGS. 1 and 2 as a light source of the pixel PXL. For example, each pixel PXL of the display panel PNL may include at least one light emitting element LD.

In FIG. 3, a structure of the display panel PNL is briefly shown centering on a display area DA. However, according to an embodiment, at least one driving circuit unit, lines and/or pads, which are not shown, may be further disposed in the display panel PNL.

Referring to FIG. 3, the display panel PNL may include a base layer BSL and pixels PXL provided on the base layer BSL.

The display panel PNL and the base layer BSL for forming the display panel PNL may include the display area DA for displaying an image, and a non-display area NDA excluding the display area DA. The display area DA may comprise a screen on which the image is displayed, and the non-display area NA may be the remaining area excluding the display area DA.

The display panel PNL may be provided in various shapes. For example, the display panel PNL may be provided in a rectangular plate shape, but is not limited thereto. For example, the display panel PNL may have a shape such as a circle or an ellipse. In FIG. 3, the display panel PNL has angled corners, but the embodiments are not limited thereto. For example, the display panel PNL may have curved corners.

In FIG. 3, the display panel PNL has a pair of short sides and a pair of long sides. The extension direction of the short side is indicated as the first direction DR1, the extension direction of the long side is indicated as the second direction DR2, and a direction (for example, a thickness or height direction of the display panel PNL) perpendicular to both the long side and the short side is indicated as the third direction DR3. However, this may be changed according to the shape of the display panel PNL.

The display area DA may have various shapes. For example, the display area DA may have various shapes including a rectangle, a circle, or an ellipse. In an embodiment, the display area DA may have a shape matching the shape of the display panel PNL, but is not limited thereto.

The pixels PXL may be disposed in the display area DA on the base layer BSL. For example, the display area DA may include multiple pixel areas in which the pixels PXL are disposed. The non-display area NA may be disposed around the display area DA, and various lines, pads, and/or an embedded circuit unit connected to the pixels PXL of the display area DA may be disposed in the non-display area NA.

According to an embodiment, at least two types of pixels PXL emitting light of different colors may be disposed in the display area DA. Multiple pixels PXL, for example, a red pixel, a green pixel, and a blue pixel, that are disposed adjacent to each other and emit light of different colors may comprise each pixel unit.

In an embodiment, each pixel PXL may be set as a pixel of a predetermined color, and may include a light emitting element LD that generates light of the predetermined color. In another embodiment, at least some of the pixels PXL may include light emitting elements LD that generate light of a first color, and may also include a light conversion layer LCL comprised of color conversion particles, such as quantum dots of a predetermined color, for converting light of a first color into a second color. Accordingly, the light of the second color may be generated by some of the pixels PXL.

The pixel PXL may include at least one light source driven by a predetermined control signal (for example, a scan signal and a data signal) and/or predetermined power (for example, first power and second power). In an embodiment, the light source may include at least one light emitting element LD according to the embodiment of FIGS. 1 and 2, for example, at least one stick-shaped light emitting element LD having a nanometer to micrometer scale size. Various types of light emitting elements may be used as the light source of the pixel PXL. For example, in another embodiment, the light source of each pixel PXL may be comprised of a light emitting element of a core-shell structure or a flip chip structure.

In the embodiments, the pixel PXL may have a structure according to one of the examples described below. Each pixel PXL may have these structures applied alone, or in a combination.

In an embodiment, the pixel PXL may be configured as an active pixel, but the embodiments are not limited thereto. For example, the pixel PXL may be configured to be a pixel for a passive or active light emitting display devices having a variety of structures and/or driving methods.

Figure 4:
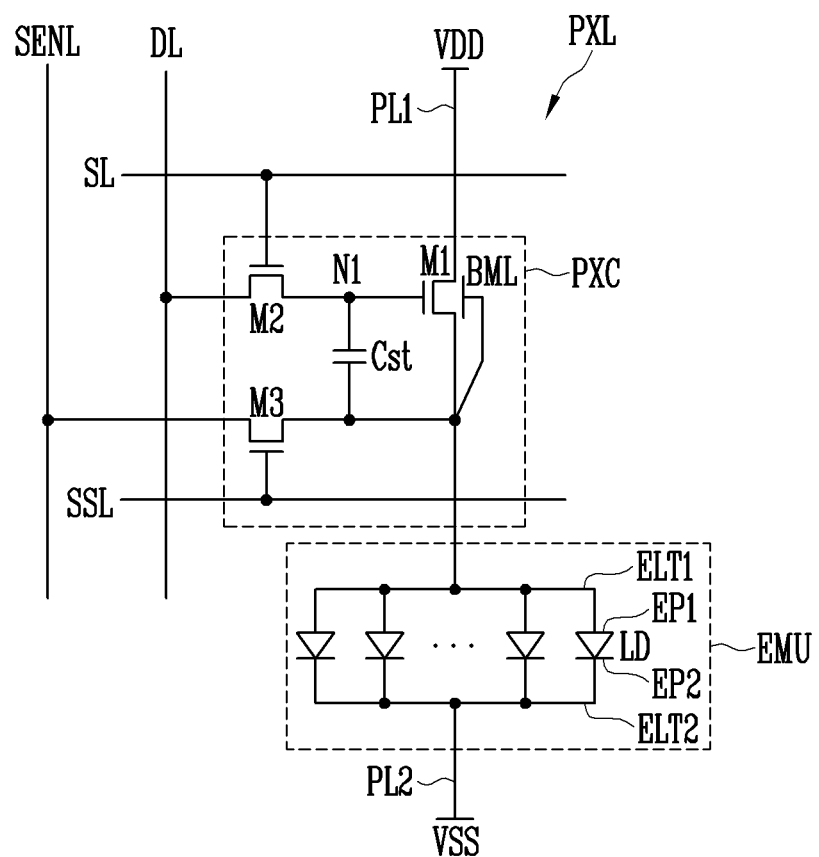
FIG. 4 is a circuit diagram illustrating a pixel according to an embodiment.

FIG. 4 is a circuit diagram illustrating the pixel PXL according to an embodiment. For example, FIG. 4 is a circuit diagram illustrating an embodiment of the pixel PXL that may be disposed in the display area DA of FIG. 3.

Referring to FIG. 4, the pixel PXL includes a light emitting unit EMU for generating light of a luminance corresponding to a data signal. The pixel PXL may further include a pixel circuit PXC for driving the light emitting unit EMU.

The light emitting unit EMU may include at least one light emitting element LD connected between first power VDD and second power VSS. For example, the light emitting unit EMU may include a multiple light emitting elements LD.

For example, the light emitting unit EMU may include a first electrode ELT1 (also referred to as a "first alignment electrode") connected to the first power VDD via the pixel circuit PXC and a first power line PL1, a second electrode ELT2 (also referred to as a "second alignment electrode") connected to the second power VSS via a second power line PL2, and the light emitting elements LD connected in parallel in the same direction between the first and second electrodes ELT1 and ELT2. In an embodiment, the first electrode ELT1 may be an anode electrode of the light emitting unit EMU, and the second electrode ELT2 may be a cathode electrode of the light emitting unit EMU, but the embodiments are not limited thereto.

Each of the light emitting elements LD may include the first end portion EP1 (for example, a P-type end portion) connected to the first power VDD through the first electrode ELT1 and/or the pixel circuit PXC, and the second end portion EP2 (for example, an N-type end portion) connected to the second power VSS through the second electrode ELT2. The light emitting elements LD may be connected in parallel in a forward direction between the first and second electrodes ELT1 and ELT2.

Each light emitting element LD connected in the forward direction between the first power VDD and the second power VSS may comprise each effective light source. The effective light sources may be gathered to comprise the light emitting unit EMU of the pixel PXL.

The first power VDD and the second power VSS may have different potentials so that the light emitting elements LD emit light. For example, the first power VDD may be set as a high potential power, and the second power VSS may be set as a low potential power. The potential difference between the first power VDD and the second power VSS may be set to be equal to or greater than the threshold voltage of the light emitting elements LD during the light emission period of the pixel PXL.

The first end portions EP1 of the light emitting elements LD comprising each light emitting unit EMU may be connected to the pixel circuit PXC through the first electrode ELT1, and may be connected to the first power VDD through the pixel circuit PXC and the first power line PL1. The second end portions EP2 of the light emitting elements LD may be connected to the second power VSS through the second electrode ELT2 and the second power line PL2.

The light emitting elements LD may emit light at a luminance corresponding to a driving current supplied through a corresponding pixel circuit PXC. For example, during each frame period, the pixel circuit PXC may supply a driving current corresponding to a grayscale value to be expressed in a corresponding frame to the light emitting unit EMU. The driving current supplied to the light emitting unit EMU may be divided and flow to the light emitting elements LD connected in the forward direction. Accordingly, while each light emitting element LD emits light at a luminance corresponding to the current flowing therein, the light emitting unit EMU may emit light of a luminance corresponding to the driving current.

In an embodiment, the light emitting unit EMU may further include at least one ineffective light source in addition to the light emitting elements LD. For example, at least one ineffective light emitting element, which is arranged in a reverse direction or which has at least one end portion floated, may be further included in at least one series stage. The ineffective light emitting element maintains a deactivated state even though the driving voltage (for example, a driving voltage of a forward direction) is applied between the first and second electrodes ELT1 and ELT2, and thus may substantially maintain a non-light emitting state.

Although in FIG. 4 the pixel PXL includes a light emitting unit EMU of a parallel structure, the embodiments are not limited thereto. For example, the pixel PXL may include a light emitting unit EMU of a series structure or of a series and parallel structure. For example, the light emitting unit EMU may include multiple light emitting elements LD connected in the series structure or the series and parallel structure between the first electrode ELT1 and the second electrode ELT2.

The pixel circuit PXC may be connected between the first power VDD and the first electrode ELT1. The pixel circuit PXC may be connected to a scan line SL and a data line DL of a corresponding pixel PXL. The pixel circuit PXC may be connected to a sensing signal line SSL and a sensing line SENL.

The pixel circuit PXC may include a first transistor M1, a second transistor M2, a third transistor M3, and a storage capacitor Cst.

The first transistor M1 may be connected between the first power VDD and the first electrode ELT1 of the light emitting unit EMU. The gate electrode of the first transistor M1 may be connected to a first node N1. The first transistor M1 may control the driving current supplied to the light emitting unit in correspondence with a voltage of the first node N1. The first transistor M1 may be a driving transistor that controls the driving current of the pixel PXL.

In an embodiment, the first transistor M1 may include a bottom metal layer BML (also referred to as a "lower metal electrode", a "lower electrode", or a "lower light blocking layer"). For example, when driving the pixel PXL, a back-biasing technology (or sync technology) of moving the threshold voltage of the first transistor M1 in a negative direction or a positive direction by applying a back-biasing voltage to the lower metal layer BML of the first transistor M1 may be applied. The threshold voltage of the first transistor M1 may be changed by applying a source-sink technology by connecting the lower metal layer BML to an electrode, for example, a source electrode, of the first transistor M1. When the lower metal layer BML is disposed under a semiconductor layer comprising a channel of the first transistor M1, the lower metal layer BML may serve as a light blocking pattern and stabilize the operation characteristic of the first transistor M1. In the embodiments, the function and utilization methods of the lower metal layer BML are not limited to these examples.

The second transistor M2 may be connected between the data line DL and the first node N1. The gate electrode of the second transistor M2 may be connected to the scan line SL. The second transistor M2 may be turned on when a scan signal of a gate-on voltage (for example, a high-level voltage) is supplied from the scan line SL, to electrically connect the data line DL and the first node N1.

For each frame period, a data signal of a corresponding frame is supplied to the data line DL, and the data signal is transferred to the first node N1 through the turned on second transistor M2 during a period in which the scan signal of the gate-on voltage is supplied. The second transistor M2 may be a switching transistor for transferring each data signal to the inside of the pixel PXL.

One electrode of the storage capacitor Cst is electrically connected to the first node N1, and another electrode is electrically connected to the first electrode ELT1 (or a second electrode of the transistor M1). The storage capacitor Cst charges a voltage corresponding to the data signal supplied to the first node N1 during each frame period.

The third transistor M3 may be connected between the first electrode ELT1 of the light emitting unit EMU and the sensing line SENL. The gate electrode of the third transistor M3 may be connected to the sensing signal line SSL. The third transistor M3 may transfer a voltage value applied to the first electrode ELT1 of the light emitting unit EMU to the sensing line SENL according to a sensing signal supplied to the sensing signal line SSL during a predetermined sensing period. The voltage value transferred through the sensing line SENL may be provided to an external circuit (for example, a timing controller), and the external circuit may extract characteristic information (for example, the threshold voltage or the like of the first transistor M1) of each pixel PXL based on the provided voltage value. The extracted characteristic information may be used to convert image data so that a characteristic deviation between the pixels PXL is compensated.

In FIG. 4, all transistors included in the pixel circuit PXC, for example, the first, second, and third transistors M1, M2, and M3 may be N-type transistors, but the embodiments are not limited thereto. For example, the first, second, and third transistors M1, M2, and M3 may be changed to P-type transistors. In another embodiment, the pixel circuit PXC may include both of P-type and N-type transistors. For example, some of the transistors (for example, the first, second, and third transistors M1, M2, M3) included in the pixel circuit PXC may be P-type transistors, and the others may be N-type transistors. The voltage level of control signals (for example, the scan signal, the data signal, and/or the sensing signal) for driving each transistor may be adjusted according to the type of the transistors.

The structure and a driving method of the pixel PXL may be changed according to the embodiments. For example, the pixel circuit PXC may also be comprised of a pixel circuit of other structures and/or driving methods, in addition to the embodiment shown in FIG. 3.

For example, the pixel circuit PXC may not include the third transistor M3. The pixel circuit PXC may additionally include at least one or more other circuit elements such as a transistor for compensating for the threshold voltage of the first transistor M1, a transistor for initializing the voltage of the first node N1 or the first electrode ELT1 of the light emitting unit EMU, a transistor for controlling a period in which the driving current is supplied to the light emitting unit EMU, and/or a boosting capacitor for boosting the voltage of the first node N1.

In another embodiment, when the pixel PXL is configured for a passive light emitting display device or the like, the pixel circuit PXC may be omitted. Each of the first and second electrodes ELT1 and ELT2 of the light emitting unit EMU may be directly connected to the scan line SL, the data line DL, the first power line PL1, the second power line PL2, other signal lines or power lines, or the like.

Figure 5:
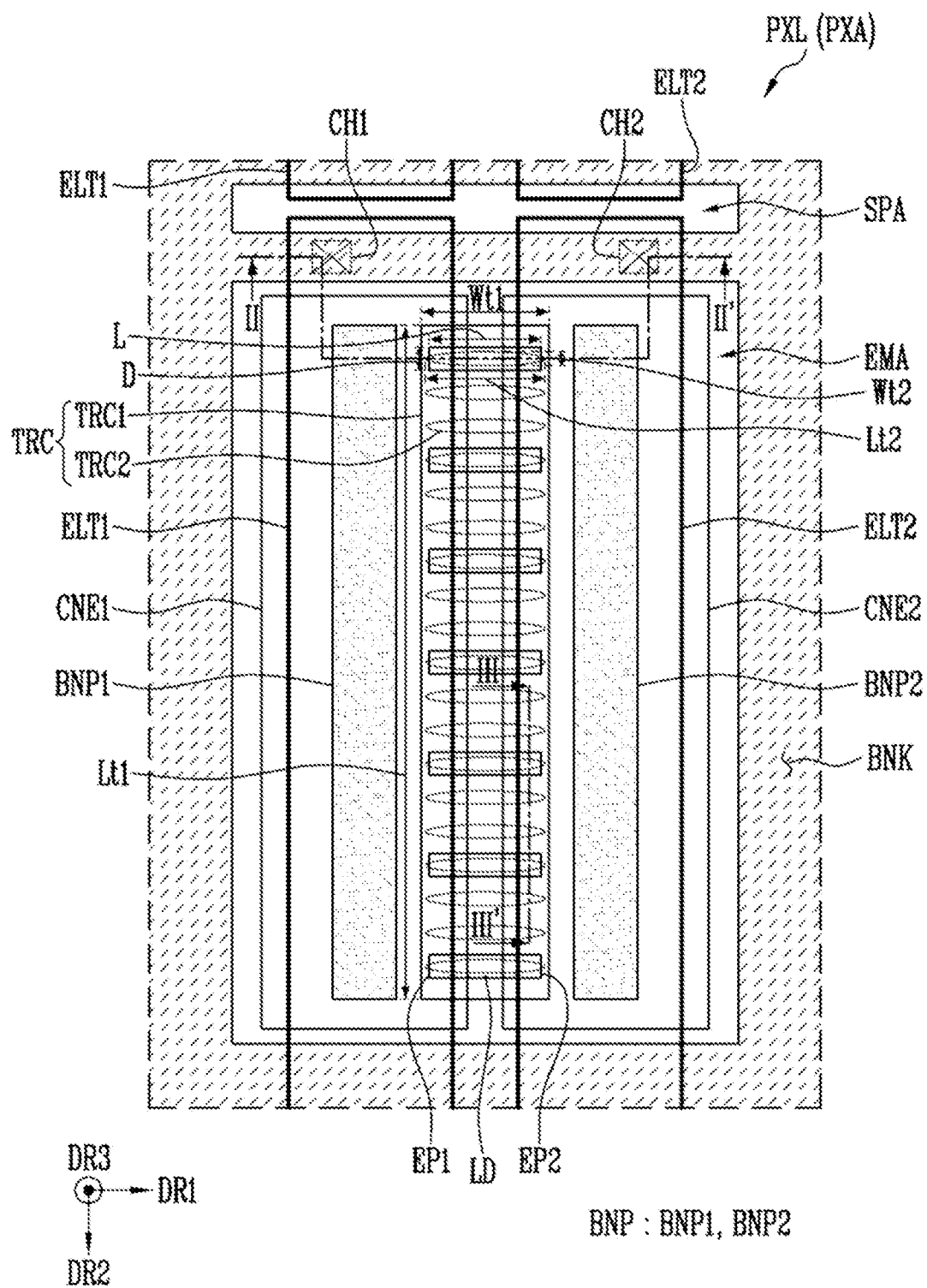
FIG. 5 is a schematic plan view illustrating the pixel according to an embodiment.

FIG. 5 is a schematic plan view illustrating the pixel PXL according to an embodiment. In FIG. 5, a structure of the pixel PXL is shown centering on the light emitting unit EMU of the pixel PXL. For example, FIG. 5 illustrates a structure of the light emitting unit EMU including the first and second electrodes ELT1 and ELT2, and the light emitting elements LD connected in parallel between the first and second electrodes ELT1 and ELT2, as in the embodiment of FIG. 4. However, the structure of the light emitting unit EMU, including the number and a connection structure of the light emitting elements LD, may be variously changed.

FIG. 5 shows an embodiment in which each light emitting unit EMU is connected to a predetermined power line (for example, the first power line PL1 and/or the second power line PL2), a circuit element (for example, at least one circuit element comprising the pixel circuit PXC) and/or a signal line (for example, the scan line SL and/or the data line DL) through first and second contact holes CH1 and CH2. However, the embodiments are not limited thereto. For example, in another embodiment, at least one of the first and second electrodes ELT1 and ELT2 of each pixel PXL may be directly connected to the predetermined power line and/or the signal line without passing through a contact hole, an intermediate line, and/or the like.

Referring to FIG. 5, the pixel PXL is provided in each pixel area PXA. The pixel area PXA may comprehensively mean a pixel circuit area in which circuit elements for comprising a corresponding pixel PXL are disposed and a light emitting area EMA in which the light emitting unit EMU of the pixel PXL is disposed.

The light emitting area EMA may be an area in which the light emitting elements LD connected in the forward direction between the first and second electrodes ELT1 and ELT2 comprising the light emitting unit EMU of each pixel PXL may be disposed. Hereinafter, each of the embodiments are described where the light emitting elements LD may be disposed in the light emitting areas EMA. In the light emitting area EMA, predetermined electrodes (for example, the first and second electrodes ELT1 and ELT2, and/or first and second contact electrodes CNE1 and CNE2) electrically connected to the light emitting elements LD, or a region of the electrodes may be disposed. In an embodiment, the light emitting area EMA may be surrounded by a bank BNK.

The pixel PXL may include the first electrode ELT1 and the second electrode ELT2 disposed in the light emitting area EMA, and the light emitting elements LD disposed and/or arranged between the first and second electrodes ELT1 and ELT2. The light emitting elements LD are disposed and/or arranged between the first and second electrodes ELT1 and ELT2 such that at least one region of each of the light emitting elements LD is positioned in a region between the first and second electrodes ELT1 and ELT2 on a plan view.

The pixel PXL may further include the first contact electrode CNE1 and the second contact electrode CNE2 disposed on the first end portions EP1 and the second end portions EP2 of the light emitting elements LD, and a bank pattern BNP disposed under the first and second electrodes ELT1 and ELT2. When at least one region of the bank BNK is positioned in each pixel area PXA, the pixel PXL may further include the bank BNK (or one region of the bank BNK).

The bank pattern BNP may be disposed to overlap a region of the first and second electrodes ELT1 and ELT2. For example, the bank pattern BNP may be disposed under the first and second electrodes ELT1 and ELT2 and may overlap a region of each of the first and second electrodes ELT1 and ELT2 in a plan view.

The bank pattern BNP may form a reflective wall structure around the light emitting elements LD, and may be formed as a separate or integral pattern. For example, the bank pattern BNP may include a first bank pattern portion BNP1 and a second bank pattern portion BNP2 separated from each other. The first bank pattern portion BNP1 may be disposed under the first electrode ELT1 and overlap a region of the first electrode ELT1, and the second bank pattern portion BNP2 may be disposed under the second electrode ELT2 and overlap a region of the second electrode ELT2. In another embodiment, the bank pattern BNP may be configured as an integral pattern of a shape surrounding a region where the light emitting elements LD are disposed while having an opening or a groove corresponding to the region where the light emitting elements LD are disposed.

When the bank pattern BNP is disposed under a region of each of the first and second electrodes ELT1 and ELT2, the first and second electrodes ELT1 and ELT2 may protrude in an upward direction in the region where the bank pattern BNP is formed. The bank pattern BNP may comprise reflective wall structure together with the first and second electrodes ELT1 and ELT2. For example, the first and second electrodes ELT1 and ELT2 and/or the bank pattern BNP may be formed of a reflective material, or a reflective layer may be formed on a protruded sidewall SDW (refer to FIG. 6) of the first and second electrodes ELT1 and ELT2 and/or the bank pattern BNP. Accordingly, the light emitted from the first and second end portions EP1 and EP2 of the light emitting elements LD facing the first and second electrodes ELT1 and ELT2 may be guided to be more directed to the front direction of the display panel PNL. Here, the front direction of the display panel PNL may include a direction (for example, the third direction DR3) perpendicular to the display panel PNL, and may comprehensively mean a direction belonging to a predetermined viewing angle range. As described above, when a region of the first and second electrodes ELT1 and ELT2 is protruded in the upward direction using the bank pattern BNP, light efficiency of the pixel PXL may be improved.

In another embodiment, the pixel PXL may not include the bank pattern BNP. In this case, the first and second electrodes ELT1 and ELT2 may have a substantially flat surface or may have an uneven surface by being formed in different thicknesses for each region.

The first electrode ELT1 and the second electrode ELT2 may be disposed to be spaced apart from each other in each pixel area PXA. For example, the first and second electrodes ELT1 and ELT2 may be disposed to be spaced apart from each other in the first direction DR1 in the light emitting area EMA of each pixel PXL.

The first and second electrodes ELT1 and ELT2 may have various shapes. For example, each of the first and second electrodes ELT1 and ELT2 may have a bar shape extending along one direction. Each of the first and second electrodes ELT1 and ELT2 may have a bar shape extending in the second direction DR2 crossing or intersecting (for example, orthogonal to) the first direction DR1. In an embodiment, the first direction DR1 may be a row direction (or a horizontal direction) of the display area DA, and the second direction DR2 may be a column direction (or a vertical direction) of the display area DA, but the embodiments are not limited thereto.

The shape and/or a structure of the first and second electrodes ELT1 and ELT2 may be modified. In each pixel area PXA, the first and second electrodes ELT1 and ELT2 may have a uniform width or a non-uniform width, and may or may not include a bent portion. The shapes, structure, and other features of the first and second electrodes ELT1 and ELT2 may be changed based on the embodiments.

Although FIG. 5 discloses an embodiment in which one first electrode ELT1 and one second electrode ELT2 are disposed in each light emitting area EMA, the number of first and second electrodes ELT1 and ELT2 disposed in each pixel PXL may be modified.

When multiple first electrodes ELT1 are disposed in one pixel PXL, the first electrodes ELT1 may be integrally or non-integrally connected to each other. For example, the first electrodes ELT1 may be integrally connected or may be connected to each other by a bridge pattern positioned on a layer (for example, a circuit layer on which the pixel circuit PXC is disposed) different from that of the first electrodes ELT1. Similarly, when multiple second electrodes ELT2 are disposed in one pixel PXL, the second electrodes ELT2 may be integrally or non-integrally connected to each other.

The first electrode ELT1 and/or the second electrode ELT2 may have a pattern separated for each pixel PXL or a pattern commonly connected across several of the pixels PXL. For example, as shown in FIG. 5, the first and second electrodes ELT1 and ELT2 may be disconnected in a separation area SPA positioned outside a corresponding light emitting area EMA. In another embodiment, at least one of the first and second electrodes ELT1 and ELT2 may have an independent pattern disconnected in the light emitting area EMA. For example, the first electrode ELT1 may be disconnected inside the light emitting area EMA, or both of the first and second electrodes ELT1 and ELT2 may be disconnected inside the light emitting area EMA. In another embodiment, the first electrode ELT1 may be disconnected in the separation area SPA, or both of the first and second electrodes ELT1 and ELT2 may be disconnected in the separation area SPA. In other embodiments, the first electrode ELT1 may have an independent pattern disconnected inside the separation area SPA or the light emitting area EMA, and an end portion of the second electrode ELT2 may extend in the first direction DR1 or the second direction DR2 and may be integrally connected to the second electrode ELT2 of another pixel PXL adjacent in the first direction DR1 or the second direction DR2. At least one of the first and second electrodes ELT1 and ELT2 may be disconnected in the separation area SPA or the light emitting area EMA.

Before the process of forming the pixel PXL is complete, (especially before the alignment of the light emitting elements LD is completed), the first electrodes ELT1 of the pixels PXL disposed in the display area DA may be connected to each other, and the second electrodes ELT2 of the pixels PXL may be connected to each other. For example, before the alignment of the light emitting elements LD is completed, the first electrodes ELT1 of the pixels PXL may be integrally or non-integrally connected to each other to configure a first alignment line, and the second electrodes ELT2 of the pixels PXL may be integrally or non-integrally connected to each other to configure a second alignment line. When the first electrodes ELT1 or the second electrodes ELT2 of the pixels PXL are non-integrally connected to each other, the first electrodes ELT1 or the second electrodes ELT2 may be electrically connected to each other by at least one contact hole, a bridge pattern, and/or the like.

The first alignment line and the second alignment line may receive a first alignment signal (or a first alignment voltage) and a second alignment signal (or a second alignment voltage) in aligning the light emitting elements LD, respectively. For example, any one of the first and second alignment lines may receive an alignment signal of an alternating current type, and the other of the first and second alignment lines may receive an alignment voltage (for example, a ground voltage) having a constant voltage level.

In aligning the light emitting elements LD, a predetermined alignment signal may be applied to the first and second alignment electrodes. Accordingly, an electric field may be formed between the first and second alignment lines, and thus each of the light emitting elements LD supplied to the light emitting area EMA may be self-aligned in a predetermined direction. After the alignment of the light emitting elements LD is completed, at least the first alignment line may be disconnected in the separation area SPA or the like to be separated into each of the first electrodes ELT1 of each pixel PXL, and thus the pixels PXL may be individually driven.

The first electrode ELT1 may be electrically connected to a predetermined circuit element (for example, at least one transistor of the pixel circuit PXC), a power line (for example, the first power line PL1), and/or the signal line (for example, the scan line SL, the data line DL, or a predetermined control line) through the first contact hole CH1. In another embodiment, the first electrode ELT1 may be directly connected to a predetermined power line or signal line.

In an embodiment, the first electrode ELT1 may be electrically connected to the predetermined circuit element disposed under the first electrode ELT1 through the first contact hole CH1 and may be electrically connected to a first line through the circuit element. The first line may be the first power line PL1 for supplying the first power VDD, but is not limited thereto.

The second electrode ELT2 may be electrically connected to a predetermined circuit element (for example, at least one transistor of the pixel circuit PXC), a power line (for example, the second power line PL2), and/or a signal line (for example, the scan line SL, the data line DL, or a predetermined control line) through the second contact hole CH2. In another embodiment, the second electrode ELT2 may be directly connected to a predetermined power line or signal line.

In an embodiment, the second electrode ELT2 may be electrically connected to a second line disposed under the second electrode ELT2 through the second contact hole CH2. The second line may be the second power line PL2 for supplying the second power VSS, but is not limited thereto.

Each of the first and second contact holes CH1 and CH2 may or may not overlap the bank BNK. For example, as shown in FIG. 5, the first and second contact holes CH1 and CH2 may be disposed between the light emitting area EMA and the separation area SPA, and may overlap the bank BNK. In another embodiment, at least one of the first and second contact holes CH1 and CH2 may be disposed in the light emitting area EMA or the separation area SPA.

Each of the first and second electrodes ELT1 and ELT2 may be comprised of a single layer or of multiple layers. For example, the first electrode ELT1 may include a reflective electrode layer of at least one layer including a reflective conductive material, and may further include at least one transparent electrode layer and/or a conductive capping layer. Similarly, the second electrode ELT2 may include a reflective electrode layer of at least one layer including a reflective conductive material, and may further include at least one transparent electrode layer and/or a conductive capping layer. The reflective conductive material may include at least one of a variety of metal materials such as a metal having high reflectance in the visible light wavelength band, for example, aluminum (Al), gold (Au), and silver (Ag), but the embodiments are not limited thereto.

The light emitting elements LD may be disposed between the first electrode ELT1 and the second electrode ELT2. For example, the light emitting elements LD may be positioned between the first electrode ELT1 and the second electrode ELT2 and may be arranged in parallel to each other. For example, each light emitting element LD may be aligned in the first direction DR1 between the first electrode ELT1 and the second electrode ELT2, and may be electrically connected between the first and second electrodes ELT1 and ELT2.

In FIG. 5, all light emitting elements LD are uniformly aligned in the first direction DR1, but the embodiments are not limited thereto. For example, at least one of the light emitting elements LD may be aligned in a diagonal direction or the like inclined with respect to the first and second directions DR1 and DR2 between the first and second electrodes ELT1 and ELT2.

According to an embodiment, each light emitting element LD may be an ultra-small light emitting element of a size in the nanometer to micrometer scale ranges, using a material of an inorganic crystal structure, but the embodiments are not limited thereto. Each light emitting element LD may be a rod-shaped light emitting element LD as shown in FIGS. 1 and 2, but the embodiments are not limited thereto.

Each light emitting element LD may include the first end portion EP1 and the second end portion EP2. The first end portion EP1 may be disposed adjacent to the first electrode ELT1, and the second end portion EP2 may be disposed adjacent to the second electrode ELT2. For example, the first end portion EP1 may be disposed to face the first electrode ELT1 and the second end portion EP2 may be disposed to face the second electrode ELT2. The first end portion EP1 may or may not overlap the first electrode ELT1. The second end portion EP2 may or may not overlap the second electrode ELT2.

In an embodiment, the first end portion EP1 of each of the light emitting elements LD may be electrically connected to the first electrode ELT1, and the second end portion EP2 of each of the light emitting elements LD may be electrically connected to the second electrode ELT2. In another embodiment, the first end portion EP1 of each of the light emitting elements LD may be connected to the first electrode ELT1 by directly contacting the first electrode ELT1, and the second end portion EP2 of each of the light emitting elements LD may be connected to the second electrode ELT2 by directly contacting the second electrode ELT2.

Each light emitting element LD connected in the forward direction between the first and second electrodes ELT1 and ELT2 may configure an effective light source of the corresponding pixel PXL. The effective light sources may be gathered to form the light emitting unit EMU of the pixel PXL.

The light emitting elements LD may be dispersed in a predetermined solution, and may be supplied to each pixel area through various methods such as an inkjet method or a slit coating method. For example, the light emitting elements LD may be mixed with a volatile solvent and supplied to the light emitting area EMA of each pixel PXL. When a predetermined alignment voltage (or an alignment signal) is applied to the first and second electrodes ELT1 and ELT2 of the pixels PXL, an electric field may be formed between the first and second electrodes ELT1 and ELT2, and thus the light emitting elements LD may be aligned between the first and second electrodes ELT1 and ELT2. After the light emitting elements LD are aligned, the light emitting elements LD may be stably arranged between the first and second electrodes ELT1 and ELT2 by performing a drying process or the like to remove the solvent.

In an embodiment, the light emitting elements LD may be biased and aligned so that the light emitting elements LD may be aligned in a more specific direction. For example, the light emitting elements LD may be aligned using electromagnetic force so that a larger number and/or ratio of the light emitting elements LD supplied to each light emitting area EMA are connected between the first and second electrodes ELT1 and ELT2 in the forward direction. For example, the light emitting elements LD may be biased and aligned so that more of the first end portions EP1 of the light emitting elements LD face the first electrode ELT1 (or the first alignment line before being separated into the first electrode ELT1), and more of the second end portions EP2 of the light emitting elements LD face the second electrode ELT2 (or the second alignment line before being separated into the second electrode ELT2). Thereafter, the drying process or the like for removing the solvent may be performed when the light emitting elements LD in an aligned state.

When the light emitting elements LD are biased and aligned in a desired direction as described above, the utilization rate of the light emitting elements LD supplied to each light emitting area EMA may be increased, and the luminance of the pixel PXL may be improved. However, an eccentric alignment in which the light emitting elements LD are more biased and aligned toward a specific electrode (or a specific alignment line) may occur during a bias alignment process or the like using an electromagnetic force or the like. For example, the light emitting elements LD may be arranged to be closer to the sidewall SDW (refer to FIG. 6) of the first bank pattern portion BNP1 or closer to the second bank pattern portion BNP2. For example, when the light emitting elements LD are biased in a direction of the first electrode ELT1 (or the first alignment line) and arranged, the first end portions EP1 of the light emitting elements LD may be close or in contact with the sidewall SDW (refer to FIG. 6) of the first bank pattern portion BNP1.

In case that an eccentric alignment occurs, a contact defect may occur in a subsequent contact process (for example, the process of forming the first and second contact electrodes CNE1 and CNE2 on the first and second end portions EP1 and EP2 of the light emitting elements LD, respectively). For example, when the first end portions EP1 of the light emitting elements LD are close to the first bank pattern portion BNP1, or the insulating layer formed on the sidewall SDW (refer to FIG. 6) of the first bank pattern portion BNP1, the deposition space for forming the first contact electrode CNE1 between the first end portions EP1 and the first bank pattern portion BNP1 may not be sufficient. Accordingly, the risk of a disconnection between the first contact electrode CNE1 and first end portion EP1 of the light emitting element LD may increase. When a disconnection of the first contact electrode CNE1 or the like occurs, even though the light emitting element LD is connected in the forward direction between the first and second electrodes ELT1 and ELT2, the light emitting element LD may not operate as an effective light source due to the contact defect. The utilization rate of the light emitting elements LD may be reduced, and uniformity of light emission may be reduced.

In an embodiment, a trench TRC may be formed between the first and second electrodes ELT1 and ELT2 to control the alignment position of the light emitting elements LD. For example, the trench TRC may be disposed at a position capable of preventing eccentric alignment of the light emitting elements LD, and may be formed to have a size capable of accommodating the light emitting elements LD. In an embodiment, the light emitting elements LD may be arranged (or disposed) inside the trench TRC.

For example, the pixel PXL may include the trench TRC positioned between the first and second electrodes ELT1 and ELT2 in a plan view. Here, positioning the trench TRC between the first and second electrodes ELT1 and ELT2 means that at least one region (for example, at least a central region) of the trench TRC is positioned between the first and second electrodes ELT1 and ELT2.

In an embodiment, the trench TRC may be formed in an insulating layer (for example, a first insulating layer INS1 of FIGS. 6 to 8) covering the first and second electrodes ELT1 and ELT2, and may be formed at a position including a region between the first and second electrodes ELT1 and ELT2. The position of the trench TRC is not limited thereto. For example, the trench TRC may be formed on at least one or more other insulating layers, a substrate, or the like, at a position where the light emitting elements LD may be mounted. The trench TRC may or may not partially overlap the first electrode ELT1 and/or the second electrode ELT2.

In an embodiment, the trench TRC may be positioned in a region between the first and second bank pattern portions BNP1 and BNP2 and may not overlap the first and second bank pattern portions BNP1 and BNP2. For example, the trench TRC may be formed to be spaced apart from each of the first and second bank pattern portions BNP1 and BNP2 by a predetermined distance or more in a plan view. The predetermined distance may be a sufficient distance to insure there is sufficient space for stably forming the first and second contact electrodes CNE1 and CNE2 on and/or around the first and second end portions EP1 and EP2 of the light emitting elements LD in a subsequent contact process, and the predetermined distance may vary according to a design structure or the like of each pixel PXL.

According to an embodiment, the trench TRC may be a double trench, but the embodiments are not limited thereto. For example, the trench TRC may be a triple or more multiple trenches. The trench TRC may be at least a double trench.

The trench TRC may include a first trench TRC1 positioned between the first and second electrodes ELT1 and ELT2 to accommodate the light emitting elements LD and multiple second trenches TRC2 having a size less than that of the first trench TRC1 and provided (or disposed) inside the first trench TRC1. For example, the second trenches TRC2 may be provided (or disposed) on the bottom surface of the first trench TRC1 to form an uneven surface on the bottom surface of the first trench TRC1.

The trench TRC may have a width (for example, a width Wt1 of the first trench TRC1) capable of accommodating the light emitting elements LD as a whole within the first and second trenches TRC1 and TRC2. The trench TRC may have a depth DTH (refer to FIG. 6) capable of at least partially accommodating the light emitting elements LD. Accordingly, the light emitting elements LD may be stably arranged (or disposed) in the trench TRC.

The first trench TRC1 may be positioned between the first and second electrodes ELT1 and ELT2 in the first direction DR1. For example, in each light emitting area EMA, the first electrode ELT1, the first trench TRC1, and the second electrode ELT2 may be sequentially arranged along, or disposed in, the first direction DR1. The first trench TRC1 may or may not overlap the first electrode ELT1 and/or the second electrode ELT2.

In an embodiment, the first trench TRC1 may extend in the second direction DR2 and may have a size capable of accommodating the light emitting elements LD. Each of the first electrode ELT1, the first trench TRC1, and the second electrode ELT2 extend in the second direction DR2 which intersects the first direction DR1. For example, the first trench TRC1 may have the width Wt1 equal to or greater than the length L of each of the light emitting elements LD in the first direction DR1, and may have a length Lt1 corresponding to a length of a light emitting element array region defined between the electrodes ELT1 and ELT2 in the second direction DR2. The first trench TRC1 may be formed in correspondence with a region in which the light emitting elements LD are to be arranged (or disposed) in each light emitting area EMA.

According to an embodiment, when the light emitting elements LD have a size of a nano scale to micro scale range, the first trench TRC1 may have a size in the nanometer scale to micrometer scale range (for example, the width Wt1 and/or the length Lt1 may be in the nanometer scale to micrometer scale range). The first trench TRC1 may also be referred to as a nano or micro trench.

In an embodiment, each of the second trenches TRC2 may be regularly arranged along (or disposed in) a direction inside the first trench TRC1. For example, the second trenches TRC2 may be sequentially arranged along (or disposed in) an extension direction (for example, the second direction DR2) of the first trench TRC1, and each of the second trenches TRC2 may extend in a direction (for example, the first direction DR1) crossing (or intersecting) the extension direction of the trench TRC1.

In an embodiment, the second trenches TRC2 may have a size capable of partially accommodating at least one light emitting element LD. For example, the second trenches TRC2 may have a length Lt2 equal to or greater than the length L of the light emitting elements LD in the first direction DR1, and may have a width equal to or less than the diameter D (or the width of the cross section) of the light emitting elements LD in the second direction DR2. At least one light emitting element LD may be partially accommodated in at least one second trench TRC2. For example, a light emitting element LD may be partially inserted into any one of the second trenches TRC2.

According to an embodiment, when the light emitting elements LD have a size in the nanometer to micrometer scale range, the second trench TRC2 may have a size of a nanometer scale to a micrometer scale range (for example, the width Wt2 and/or the length Lt2 of a second trench TRC2 may be in the nanometer scale to micrometer scale range). The second trench TRC2 may also be referred to as a nano or micro ripple.

When the trench TRC is formed in at least a double structure as described above, an alignment characteristic of the light emitting elements LD may be improved. For example, even though the light emitting elements LD are aligned under an influence of the electromagnetic field, the eccentric alignment of the light emitting elements LD may be prevented by controlling an alignment region of the light emitting elements LD by the first trench TRC1. For example, the light emitting elements LD may be mounted in the first trench TRC1, and thus the light emitting elements LD may be prevented from being arranged close to the first bank pattern portion BNP1 or the second bank pattern portion BNP2. Accordingly, contact defects of the light emitting elements LD may be prevented or reduced, the utilization rate of the light emitting elements LD may be increased, and the light efficiency of the pixel PXL may be improved.

The light emitting elements LD may also be prevented from rotating in an aligned position or being concentrated in one region by the second trenches TRC2 forming an uneven surface on the bottom surface or the like of the first trench TRC1. For example, the light emitting elements LD may be arranged at a predetermined distance or more by the second trenches TRC2, and/or may be aligned in a direction intersecting (for example, an orthogonal direction to) the extension direction (for example, the second direction DR2) of the first and second electrodes ELT1 and ELT2 (or the first and second bank pattern portions BNP1 and BNP2).

In an embodiment, when each of at least one or more light emitting elements LD are partially inserted into any one second trench TRC2, the light emitting elements LD may be more effectively prevented from deviating from the aligned position. When the second trenches TRC2 are arranged at a distance so that the light emitting elements LD are not in contact with each other in consideration of the size (for example, the diameter D or the like) of the light emitting elements LD, the light emitting elements LD may be more effectively prevented from being concentrated. However, the embodiments are not limited thereto. For example, in another embodiment, each of the second trenches TRC2 may have a size and/or a shape that is difficult to accommodate the light emitting element LD. However, even in this case, the light emitting elements LD may be prevented from rotating in the aligned position or being concentrated.

The first contact electrode CNE1 and the second contact electrode CNE2 may be formed on the first and second end portions EP1 and EP2 of the light emitting elements LD, respectively. Accordingly, the light emitting elements LD may be stably connected between the first and second electrodes ELT1 and ELT2.

The first contact electrode CNE1 may be disposed on the first end portion EP1 of each of the light emitting elements LD arranged in the forward direction and the first electrode ELT1. The first contact electrode CNE1 may be connected to at least the first end portions EP1 of the light emitting elements LD. For example, the first contact electrode CNE1 may be connected to the first end portions EP1 of the light emitting elements LD and the first electrode ELT1, to electrically connect the first end portions EP1 to the first electrode ELT1. The first contact electrode CNE1 may also stably fix the first end portions EP1 of the light emitting elements LD.

The second contact electrode CNE2 may be disposed on the second end portion EP2 of each of the light emitting elements LD arranged in the forward direction and the second electrode ELT2. The second contact electrode CNE2 may be connected to at least the second end portions EP2 of the light emitting elements LD. For example, the second contact electrode CNE2 may be connected to the second end portions EP2 of the light emitting elements LD and the second electrode ELT2, to electrically connect the second end portions EP2 to the second electrode ELT2. The second contact electrode CNE2 may also stably fix the second end portions EP2 of the light emitting elements LD.

Although FIG. 5 illustrates the light emitting elements LD connected in parallel, the embodiments are not limited thereto. For example, the pixel PXL may include a light emitting unit EMU having a series or series and parallel structure including light emitting elements LD connected to at least two series stages. The light emitting unit EMU may further include at least one intermediate electrode connected between the first and second electrodes ELT1 and ELT2 through the light emitting elements LD, and/or at least one contact electrode for connecting the intermediate electrode to adjacent light emitting elements LD.

The bank BNK may be disposed around the light emitting area EMA to surround the light emitting area EMA of each pixel PXL. For example, the bank BNK may be disposed in a boundary area of each pixel area PXA and/or in an area between adjacent pixels PXL to surround each light emitting area EMA. For example, the bank BNK may include an opening corresponding to the light emitting area EMA of each pixel PXL, and may have a mesh shape in the entire display area DA.

In an embodiment, the bank BNK may further include an opening corresponding to the separation area SPA between adjacent pixels PXL in the first direction DR1 and/or the second direction DR2. Accordingly, alignment lines may be easily disconnected in the separation area SPA to separate the alignment lines into the individual electrodes of each pixel PXL.

The bank BNK may or may not partially overlap the first electrode ELT1 and/or the second electrode ELT2. For example, the first electrode ELT1 and/or the second electrode ELT2 may extend to an outer portion of the light emitting area EMA to overlap the bank BNK, or may be disconnected in the light emitting area EMA so as not to overlap the bank BNK.

The bank BNK may or may not overlap the first contact hole CH1 and/or the second contact hole CH2. For example, the first contact hole CH1 and/or the second contact hole CH2 may be formed to overlap the bank BNK, or may be formed in each light emitting area EMA and not overlap the bank BNK.

The bank BNK may include at least one light blocking and/or reflective material to prevent light leakage between adjacent pixels PXL. The bank BNK may include at least one black matrix material (for example, at least one light blocking material), a color filter material of a specific color, and/or the like. For example, the bank BNK may be formed of a black opaque pattern to block light transmission.

In supplying the light emitting elements LD to each pixel PXL, the bank BNK may function as a dam structure defining each light emitting area EMA to which the light emitting elements LD are supplied. For example, each light emitting area EMA may be partitioned by the bank BNK, and thus a light emitting element ink of a desired type and/or amount may be supplied to the light emitting area EMA.

In an embodiment, the bank BNK may be simultaneously formed on the same layer as the bank pattern BNP in a process of forming the bank pattern BNP of the pixels PXL. In another embodiment, the bank BNK may be formed on a layer the same as or different from that of the bank pattern BNP through a process separate from the process of forming the bank pattern BNP.

In an embodiment, at least double trenches TRC may be formed corresponding to a predetermined light emitting element array region, and thus the alignment characteristics of the light emitting elements LD may be improved. For example, the alignment position of the light emitting elements LD may be controlled by the trench TRC so that the light emitting elements LD are not eccentrically aligned. The second trenches TRC2 may control the light emitting elements LD to be more evenly arranged in each light emitting element array region where the first trench TRC1 is formed.

Accordingly, the utilization rate of the light emitting elements LD supplied to each light emitting area EMA of each pixel area PXA may be increased, and light emission characteristics of the pixel PXL such as light emission luminance and uniformity may be improved.

Figure 6:
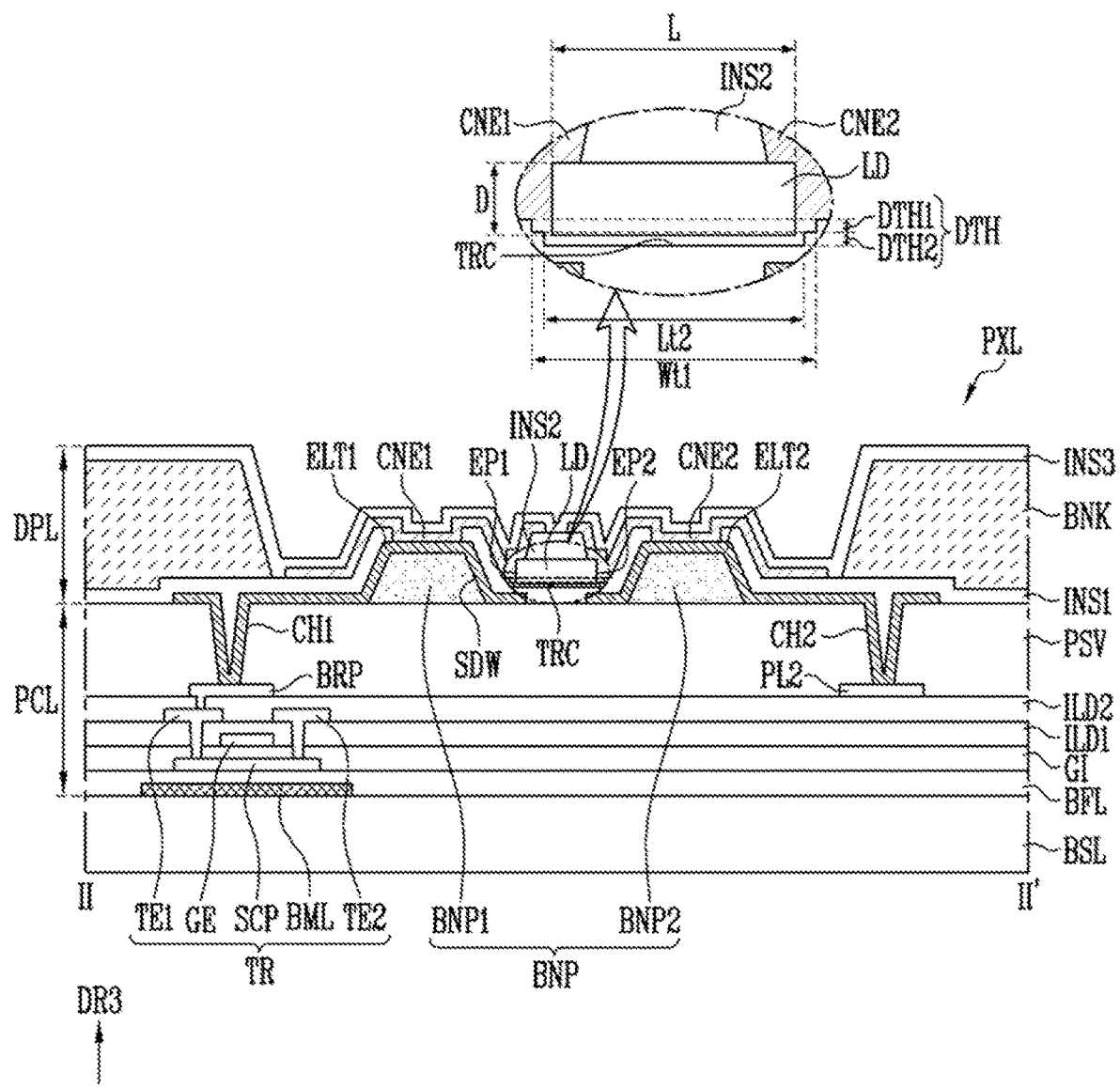
FIGS. 6 to 8 are schematic cross-sectional views illustrating the pixel according to an embodiment.
Figure 7:
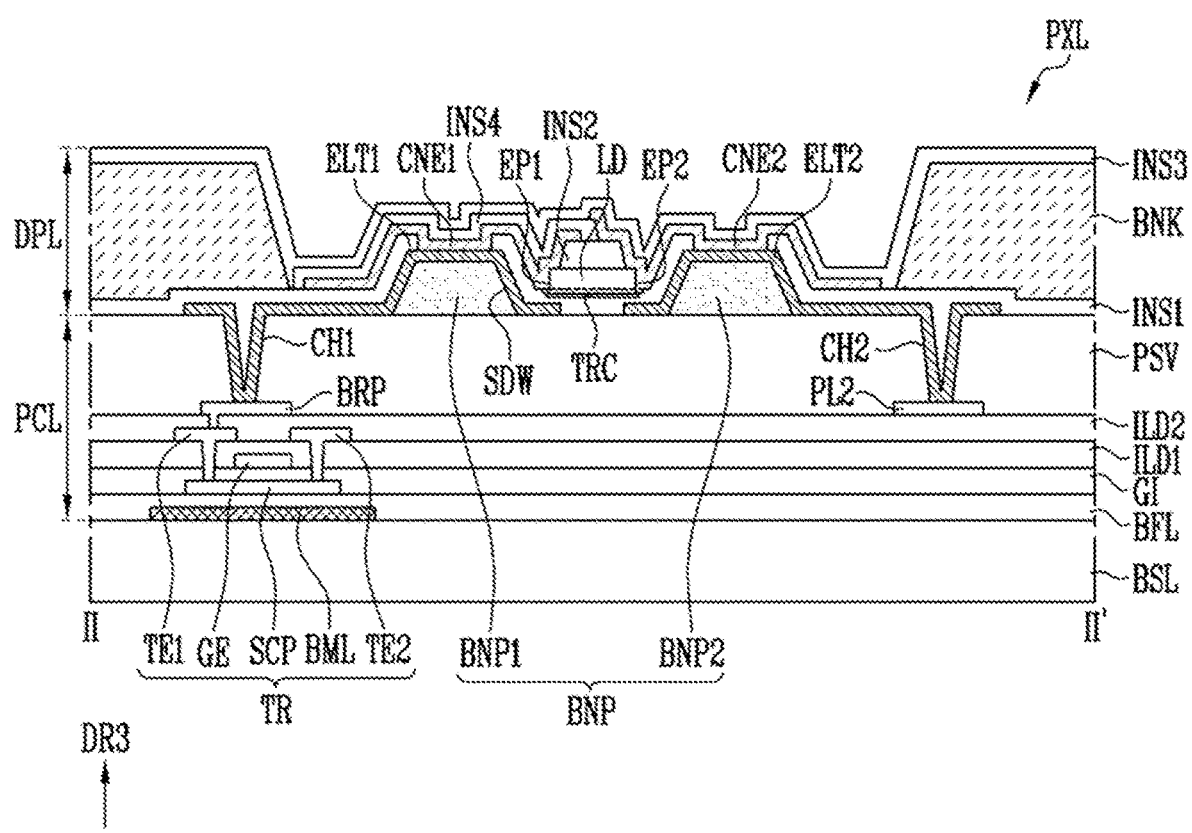
Figure 8:
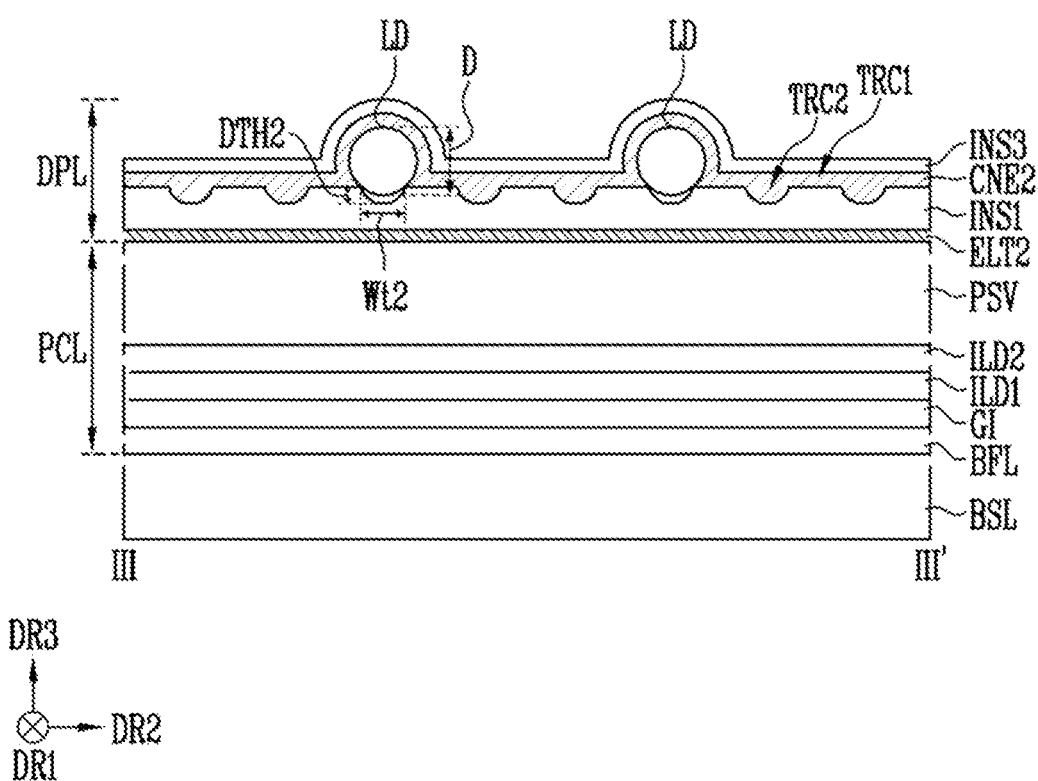

FIGS. 6 to 8 are schematic cross-sectional views illustrating the pixel PXL according to an embodiment. For example, FIGS. 6 and 7 illustrate different embodiments of a cross section of the pixel PXL taken along line II~II' of FIG. 5. In comparison with FIG. 6, the embodiment of FIG. 7 further includes a fourth insulating layer INS4 disposed on the first contact electrode CNE1. FIG. 8 illustrates an embodiment of a cross section of the pixel PXL taken along line III~III' of FIG. 5.

FIGS. 6 to 8, illustrate as an example of circuit elements that may be disposed on a circuit layer PCL, a transistor TR (for example, a transistor connected to the first electrode ELT1 through the first contact hole CH1 and the bridge pattern BRP). As an example of a line that may be disposed on the circuit layer PCL, the second power line PL2 connected to the second electrode ELT2 through the second contact hole CH2 is shown.

Referring to FIGS. 3 to 8, the pixel PXL and the display device including the same according to an embodiment may include the circuit layer PCL and a display layer DPL disposed to overlap each other on a surface of the base layer BSL. For example, the display area DA may include the circuit layer PCL disposed on a surface of the base layer BSL, and the display layer DPL disposed on the circuit layer PCL. However, the positions of the circuit layer PCL and the display layer DPL on the base layer BSL may vary according to the embodiments.

The circuit elements (for example, the transistors TR and the storage capacitors Cst) comprising the pixel circuit PXC of the corresponding pixel PXL and various lines connected to the circuit elements may be disposed in each pixel area PXA of the circuit layer PCL. The first and second electrodes ELT1 and ELT2, the light emitting elements LD, and/or the first and second contact electrodes CNE1 and CNE2 comprising the light emitting unit EMU of a corresponding pixel PXL may be disposed in each pixel area PXA of the display layer DPL.

The circuit layer PCL may include insulating layers in addition to the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV sequentially stacked on a surface of the base layer BSL.

The circuit layer PCL may further include a first conductive layer including at least one light blocking layer (or the bottom metal layer BML of the transistor TR) or the like disposed under at least a portion of the transistor TR.

For example, the first conductive layer may be disposed between the base layer BSL and the buffer layer BFL and may include the bottom metal layer BML that overlaps a gate electrode GE and/or a semiconductor pattern SCP of at least one transistor TR.

In an embodiment, the bottom metal layer BML may be connected to one electrode of a corresponding transistor TR. For example, as illustrated in FIG. 4, when the first transistor M1 includes the bottom metal layer BML, the bottom metal layer BML may be connected to a source electrode (or a drain electrode) of the first transistor M1.

The buffer layer BFL may be disposed on one surface of the base layer BSL including the first conductive layer. The buffer layer BFL may prevent an impurity from diffusing into each circuit element.

A semiconductor layer may be disposed on the buffer layer BFL. The semiconductor layer may include the semiconductor pattern SCP of each transistor TR. The semiconductor pattern SCP may include a channel region overlapping the gate electrode GE, and first and second conductive regions (for example, a source region and a drain region) disposed on both sides of the channel region.

The semiconductor pattern SCP may be formed of polysilicon, amorphous silicon, oxide semiconductor, or the like. The channel region of the semiconductor pattern SCP may be a semiconductor pattern that is not doped with an impurity, and may be an intrinsic semiconductor, and each of the first and second conductive regions of the semiconductor pattern SCP may be a semiconductor pattern doped with a predetermined impurity.

In an embodiment, the semiconductor patterns SCP of the transistors TR comprising each pixel circuit PXC may be formed of substantially the same or similar material. For example, the semiconductor pattern SCP of the transistors TR may be formed of the same material among polysilicon, amorphous silicon, and oxide semiconductor.

In another embodiment, some of the transistors TR and the other of the transistors TR may include semiconductor patterns SCP formed of different materials. For example, the semiconductor pattern SCP of some of the transistors TR may be formed of polysilicon or amorphous silicon, and the semiconductor pattern SCP of the other of the transistors TR may be formed of oxide semiconductor.

The gate insulating layer GI may be disposed on the semiconductor layer. A second conductive layer may be disposed on the gate insulating layer GI.

The second conductive layer may include the gate electrode GE of each transistor TR. The second conductive layer may further include one electrode of the storage capacitor Cst and/or a predetermined line (for example, the scan line SL).

The first interlayer insulating layer ILD1 may be disposed on the second conductive layer. A third conductive layer may be disposed on the first interlayer insulating layer ILD1.

The third conductive layer may include first and second transistor electrodes TE1 and TE2 of each transistor TR. Here, the first and second transistor electrodes TE1 and TE2 may be source and drain electrodes. The third conductive layer may further include one electrode of the storage capacitor Cst and/or a predetermined line (for example, the data line DL).

The second interlayer insulating layer ILD2 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may be formed of a single layer or multiple layers, and may include at least one inorganic insulating material and/or organic insulating material. For example, each of the buffer layer BFL, the gate insulating layer GI, the first interlayer insulating layer ILD1, and the second interlayer insulating layer ILD2 may include various types organic/inorganic insulating materials including silicon nitride ($SiN_x$), silicon oxide ($SiO_x$), silicon oxynitride ($SiO_xN_y$), or the like.

The fourth conductive layer may include the bridge pattern BRP connecting the circuit layer PCL and the display layer DPL and/or a predetermined line (for example, the first power line PL1 and/or the second power line PL2). The bridge pattern BRP may be connected to the first electrode ELT1 of the light emitting unit EMU through the first contact hole CH1 or the like. The second power line PL2 may be connected to the second electrode ELT2 of the light emitting unit EMU through the second contact hole CH2 or the like.

Each of conductive patterns, electrodes and/or lines forming the first to fourth conductive layers may have conductivity by including at least one conductive material, and the embodiments are not particularly limited by the conductive material. For example, each of the conductive patterns, electrodes, and/or lines forming the first to fourth conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but the embodiments are not limited thereto.

The passivation layer PSV may be disposed on the fourth conductive layer. According to an embodiment, the passivation layer PSV may include at least an organic insulating layer and may substantially planarize a surface of the circuit layer PCL. The display layer DPL may be disposed on the passivation layer PSV.

The passivation layer PSV may be comprised of a single layer or multiple layers, and may include at least one inorganic insulating material and/or organic insulating material. For example, the passivation layer PSV may include at least one layer of an organic insulating layer and may substantially planarize the surface of the pixel circuit layer PCL. In an embodiment, the organic insulating layer may include at least one of an acrylic resin (polyacrylates resin), an epoxy resin, a phenolic resin, a polyamide resin, a polyimide resin, an unsaturated polyester resin, a poly-phenylene ethers resin, a poly-phenylene sulfides resin, and a benzocyclobutene resin.

The display layer DPL may include the light emitting unit EMU of each pixel PXL. For example, the display layer DPL may include the first and second electrodes ELT1 and ELT2 disposed in the light emitting area EMA of each pixel PXL, the light emitting elements LD arranged between the first and second electrodes ELT1 and ELT2, and the first and second contact electrodes CNE1 and CNE2 connecting the first and second electrodes ELT1 and ELT2 and the light emitting elements LD.

The display layer DPL may further include the bank pattern BNP for protruding one region of the first and second electrodes ELT1 and ELT2 in the upward direction, and the bank BNK surrounding each light emitting area EMA. The display layer DPL may further include at least one conductive layer, insulating layer, and/or the like.

For example, the display layer DPL may include the bank pattern BNP, the first and second electrodes ELT1, ELT2, the first insulating layer INS1, the light emitting elements LD, the second insulating layer INS2, the first and second contact electrodes CNE1 and CNE2, and a third insulating layer INS3 sequentially disposed and/or formed on the circuit layer PCL.

In an embodiment, the first and second contact electrodes CNE1 and CNE2 may be disposed on the same layer as shown in FIG. 6. In another embodiment, the first and second contact electrodes CNE1 and CNE2 may be disposed separately on different layers as shown in FIG. 7. In this case, the display layer DPL may further include the fourth insulating layer INS4 interposed between the first and second contact electrodes CNE1 and CNE2. For example, the fourth insulating layer INS4 may cover the first contact electrode CNE1, and an end of the fourth insulating layer INS4 may be interposed between the first contact electrode CNE1 and the second contact electrode CNE2.

The position of the bank BNK on the cross section may vary according to the embodiments. In an embodiment, the bank BNK may be formed on the first insulating layer INS1. In other embodiments, the bank BNK may be disposed on the same layer as the bank pattern BNP. The bank BNK may or may not overlap the bank pattern BNP.

The bank pattern BNP may be disposed on a surface of the base layer BSL on which the circuit layer PCL is selectively formed. The bank pattern BNP may be formed as a separate or integral pattern. The bank pattern BNP may protrude in a height direction (for example, the third direction DR3) of the base layer BSL on the surface of the base layer BSL on which the circuit layer PCL is formed. Accordingly, a region of the first and second electrodes ELT1 and ELT2 disposed on the bank pattern BNP may protrude in the upward direction.

The bank pattern BNP may include an insulating material including at least one inorganic material and/or organic material. For example, the bank pattern BNP may include at least one layer of inorganic layer including various inorganic insulating materials including silicon nitride ($SiN_x$), silicon oxide ($SiO_x$), silicon oxynitride ($SiO_xN_y$), or the like. Alternatively, the bank pattern BNP may include at least one layer of an organic layer including various types of organic insulating materials, or may be formed of a single layer or multiple layer of insulators including organic/inorganic materials in combination.

A reflective wall may be formed around the light emitting elements LD by the bank pattern BNP and the first and second electrodes ELT1 and ELT2 disposed thereon. For example, when the first and second electrodes ELT1 and ELT2 include a reflective electrode layer, light emitted from both end portions of the light emitting elements LD may be reflected from the reflective electrode layer, and may be emitted in an upward direction of each pixel PXL.

The bank pattern BNP may have various shapes. In an embodiment, the bank pattern BNP may be formed to have the side wall SDW inclined at a predetermined range of angle with respect to the base layer BSL as shown in FIGS. 6 and 7. In another embodiment, the side wall SDW of the bank pattern BNP may have a curved surface or a stepped shape. For example, the bank pattern BNP may have a cross section of a semicircle or semi-ellipse shape, and the like.

The first and second electrodes ELT1 and ELT2 may be disposed on the bank pattern BNP. According to an embodiment, the first and second electrodes ELT1 and ELT2 may protrude in the height direction of the base layer BSL while having a shape corresponding to the bank pattern BNP in a region overlapping the bank pattern BNP.

Each of the first and second electrodes ELT1 and ELT2 may include at least one conductive material. For example, the first and second electrodes ELT1 and ELT2 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but is not limited thereto. For example, the first and second electrodes ELT1 and ELT2 may include other conductive materials such as carbon nanotubes or graphene. The first and second electrodes ELT1 and ELT2 may have conductivity by including at least one of various conductive materials, and the embodiments are not limited by the materials. The first and second electrodes ELT1 and ELT2 may include the same conductive material or may include different conductive materials.

Each of the first and second electrodes ELT1 and ELT2 may comprise a single layer or multiple layers. For example, the first and second electrodes ELT1 and ELT2 may include a reflective electrode layer including a reflective conductive material (for example, metal). The first and second electrodes ELT1 and ELT2 may selectively further include at least one of a transparent electrode layer of at least one layer disposed on and/or under the reflective electrode layer, and a conductive capping layer of at least one layer covering an upper portion of the reflective electrode layer and/or the transparent electrode layer.

The first insulating layer INS1 may be disposed on a region of the first and second electrodes ELT1 and ELT2. For example, the first insulating layer INS1 may be formed to cover a region of each of the first and second electrodes ELT1 and ELT2, and may include an opening exposing another region of each of the first and second electrodes ELT1 and ELT2. For example, the first insulating layer INS1 may include openings formed on an upper surface of the bank pattern BNP. In another embodiment, the first insulating layer INS1 may also include contact holes for connecting the first and second electrodes ELT1 and ELT2 to the first and second contact electrodes CNE1 and CNE2, respectively.

The first insulating layer INS1 may be comprised of a single layer or multiple layers, and may include at least one inorganic insulating material and/or organic insulating material. In an embodiment, the first insulating layer INS1 may include at least one layer of inorganic insulating layer including at least one type of inorganic insulating material including silicon nitride ($SiN_x$), silicon oxide ($SiO_x$), or silicon oxynitride ($SiO_xN_y$).

In a region where the first insulating layer INS1 is opened, the first and second electrodes ELT1 and ELT2 may be electrically connected to the first and second contact electrodes CNE1 and CNE2, respectively.

In an embodiment, the first insulating layer INS1 may be formed to entirely cover the first and second electrodes ELT1 and ELT2. After the light emitting elements LD are supplied and aligned on the first insulating layer INS1, the first insulating layer INS1 may be partially opened to expose one region of the first and second electrodes ELT1 and ELT2. Since the first and second electrodes ELT1 and ELT2 are formed and then covered by the first insulating layer INS1 or the like, the first and second electrodes ELT1 and ELT2 may be prevented from being damaged in a subsequent process.

In an embodiment, the first insulating layer INS1 may include the trench TRC corresponding to the light emitting element arrangement region between the first and second electrodes ELT1 and ELT2. The trench TRC may accommodate the light emitting elements, and have a shape and an area capable of accommodating the light emitting elements LD. For example, the first trench TRC1 may have the width Wt1 and the length Lt such that it may accommodate the light emitting elements LD.

In the embodiments, the trench TRC may be formed in a shape and a size that ensures sufficient connection space between the light emitting elements LD and the first and second contact electrodes CNE1 and CNE2. For example, the trench TRC may have a depth DTH capable of partially accommodating the light emitting elements LD in a thickness or depth direction (for example, the third direction DR3). For example, a depth DTH1 of the first trench DTH1, a depth DTH2 of the second trench DTH2, and/or the total depth DTH of the trench TRC including the first trench TRC1 and the second trench TRC2 may be equal to or less than the diameter D (or the width of the cross section) of each of the light emitting elements LD.

For example, when the second trenches DTH2 have the depth DTH2 less than the diameter D (or the width of the cross section) of the light emitting elements LD, the light emitting elements LD may protrude above the second trenches TRC2. Accordingly, a sufficient contact area between the first and second end portions EP1 and EP2 of the light emitting elements LD and the first and second contact electrodes CNE1 and CNE2 may be stably insured.

The trench TRC (or the first insulating layer INS1 including the region in which the trench TRC is formed) may cover the first and second electrodes ELT1 and ELT2. Accordingly, the first and second electrodes ELT1 and ELT2 may not be directly exposed in a region where the light emitting elements LD are arranged. For example, when aligning the light emitting elements LD, the first and second electrodes ELT1 and ELT2 may be entirely covered by the first insulating layer INS1.

In aligning the light emitting elements LD between the first and second electrodes ELT1 and ELT2, the light emitting elements LD may be prevented from being in direct contact with the first and second electrodes ELT1 and ELT2. Accordingly, a current (for example, a large current due to an alignment signal) may be prevented from flowing through the light emitting elements LD in aligning the light emitting elements LD, thereby preventing damage to the light emitting elements LD.

In an embodiment, the trench TRC may not be formed in the first insulating layer INS1. The trench TRC may be formed on another insulating layer, substrate, and/or the like positioned under the light emitting elements LD. For example, when the first insulating layer INS1 is omitted or integrated with the passivation layer PSV, the first and second electrodes ELT1 and ELT2 may be spaced apart at a distance equal to or greater than the length L of each of the light emitting elements LD, and a trench for accommodating the light emitting elements LD may be formed in the passivation layer PSV in correspondence with a region between the first and second electrodes ELT1 and ELT2.

The light emitting elements LD may be supplied and aligned in the light emitting area EMA in which the first insulating layer INS1 or the like is formed. Before the light emitting elements LD are supplied, the bank BNK may be formed around the light emitting area EMA. For example, the bank BNK may be formed in the display area DA to surround each light emitting area EMA.

In an embodiment, at least some of the light emitting elements LD may be disposed in a horizontal direction, a diagonal direction, or the like between a pair of first and second electrodes ELT1 and ELT2 so that both end portions (the first and second end portions EP1 and EP2) overlap the first and second electrodes ELT1 and ELT2. In another embodiment, at least some of the light emitting elements LD may be disposed between the adjacent pair of first and second electrodes ELT1 and ELT2 and may not overlap the first and second electrodes ELT1 and ELT2.

The second insulating layer INS2 may be disposed on a region of the light emitting elements LD. For example, the second insulating layer INS2 may be disposed on a region of the light emitting elements LD while exposing the first and second end portions EP1 and EP2 of each of the light emitting elements LD. For example, the second insulating layer INS2 may be disposed only on the center region of each of the light emitting elements LD. The second insulating layer INS2 may be formed in an independent pattern in the light emitting area EMA of each pixel PXL, but the embodiments are not limited thereto.

The second insulating layer INS2 may be comprised of a single layer or multiple layers, and may include at least one inorganic insulating material and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), aluminum oxide ($Al_xO_y$), a photoresist (PR) material, and the like.

When the second insulating layer INS2 is formed on the light emitting elements LD after the alignment of the light emitting elements LD is completed, the light emitting elements LD may be prevented from deviating from the aligned position.

In an embodiment, when a separation space between the first insulating layer INS1 and the light emitting elements LD is present by a step and/or the trench TRC formed by the first and second electrodes ELT1 and ELT2, at least a portion of the separation space may be filled by the insulating material forming the second insulating layer INS2. According to an embodiment, the separation space may not be completely filled.

Both end portions of the light emitting elements LD, which are not covered by the second insulating layer INS2 (the first and second end portions EP1 and EP2), may be covered by the first and second contact electrodes CNE1 and CNE2, respectively.

The first and second contact electrodes CNE2 and CNE2 may be formed to be spaced apart from each other. For example, the first and second contact electrodes CNE1 and CNE2 may be disposed with the second insulating layer INS2 interposed between them, and may be disposed to be spaced apart from each other on the first and second end portions EP1 and EP2 of at least one light emitting element LD.

The first and second contact electrodes CNE1 and CNE2 may also be disposed on the first and second electrodes ELT1 and ELT2 to cover exposed regions of each of the first and second electrodes ELT1 and ELT2. For example, the first and second contact electrodes CNE1 and CNE2 may be disposed at least one region of each of the first and second electrodes ELT1 and ELT2 to be directly/indirectly in contact with each of the first and second electrodes ELT1 and ELT2 on the bank pattern BNP or around the bank pattern BNP.

Accordingly, the first and second contact electrodes CNE1 and CNE2 may be electrically connected to the first and second electrodes ELT1 and ELT2, respectively. Each of the first and second electrodes ELT1 and ELT2 may be electrically connected to the first end portion EP1 or the second end portion EP2 of at least one adjacent light emitting element LD through the first and second contact electrodes CNE1 and CNE2.

When the first and second contact electrodes CNE1 and CNE2 are formed on the same layer as in the embodiment of FIG. 6, the first and second contact electrodes CNE1 and CNE2 may be formed simultaneously in the same process, or may be sequentially formed, and the fourth insulating layer INS4 may be omitted. The manufacturing process of the pixel PXL and a display device including the pixel PXL may be simplified.

As illustrated in FIG. 7, when the first and second contact electrodes CNE1 and CNE2 are formed on different layers with the fourth insulating layer INS4 interposed between them, the first and second contact electrodes CNE1 and CNE2 may be more stably separated. For example, the fourth insulating layer INS4 may be disposed to cover the first contact electrode CNE1.

The fourth insulating layer INS4 may be comprised of a single layer or multiple layers, and may include at least one inorganic insulating material and/or organic insulating material. In an embodiment, the fourth insulating layer INS4 may include at least one layer of inorganic insulating layer including at least one type of inorganic insulating material including silicon nitride ($SiN_x$), silicon oxide ($SiO_x$), or silicon oxynitride ($SiO_xN_y$).

When the second insulating layer INS2 and/or the fourth insulating layer INS4 are/is formed on the light emitting elements LD, electrical stability between the first and second end portions EP1 and EP2 of the light emitting elements LD may be assured. Accordingly, a short circuit defect may be prevented from occurring between the first and second end portions EP1 and EP2 of the light emitting elements LD.

The first and second contact electrodes CNE1 and CNE2 may be formed of various transparent conductive materials. For example, the first and second contact electrodes CNE1 and CNE2 may include at least one transparent conductive material including ITO, IZO, ITZO, ZnO, AZO, GZO, ZTO, GTO, and FTO, and may be implemented to be substantially transparent or translucent to satisfy a predetermined transmittance. Accordingly, the light emitted from the light emitting elements LD through each of the first and second end portions EP1 and EP2 may pass through the first and second contact electrodes CNE1 and CNE2 and may be emitted to the outside of the display panel PNL.

The third insulating layer INS3 may be disposed on the first and second contact electrodes CNE1 and CNE2. For example, the third insulating layer INS3 may be entirely formed and/or disposed on the display area DA to cover the bank pattern BNP, the first and second electrodes ELT1 and ELT2, the first insulating layer INS1, the bank BNK, the light emitting elements LD, the second insulating layer INS2, the first and second contact electrodes CNE1 and CNE2, the third insulating layer INS3 and/or the fourth insulating layer INS4.

The third insulating layer INS3 may include at least one layer of an inorganic layer and/or organic layer. For example, the third insulating layer INS3 may be comprised of a single layer or multiple layers, and may include at least one inorganic insulating material and/or organic insulating material. For example, the third insulating layer INS3 may include organic/inorganic insulating materials including silicon nitride ($SiN_x$), silicon oxide ($SiO_x$), silicon oxynitride ($SiO_xN_y$), or aluminum oxide ($Al_2O_3$).

In an embodiment, the third insulating layer INS3 may include a thin film encapsulation layer of a multilayer structure. For example, the third insulating layer INS3 may be comprised of a thin film encapsulation layer of a multi-layer structure including at least two layers of inorganic insulating layers and at least one layer of organic insulating layer interposed between the at least two layers of inorganic insulating layers. However, the embodiments are not limited to these materials and/or structures of the third insulating layer INS3. In an embodiment, at least one of an overcoat layer, a filler layer, an upper substrate, and/or the like may be further disposed on the third insulating layer INS3.

Figure 9:
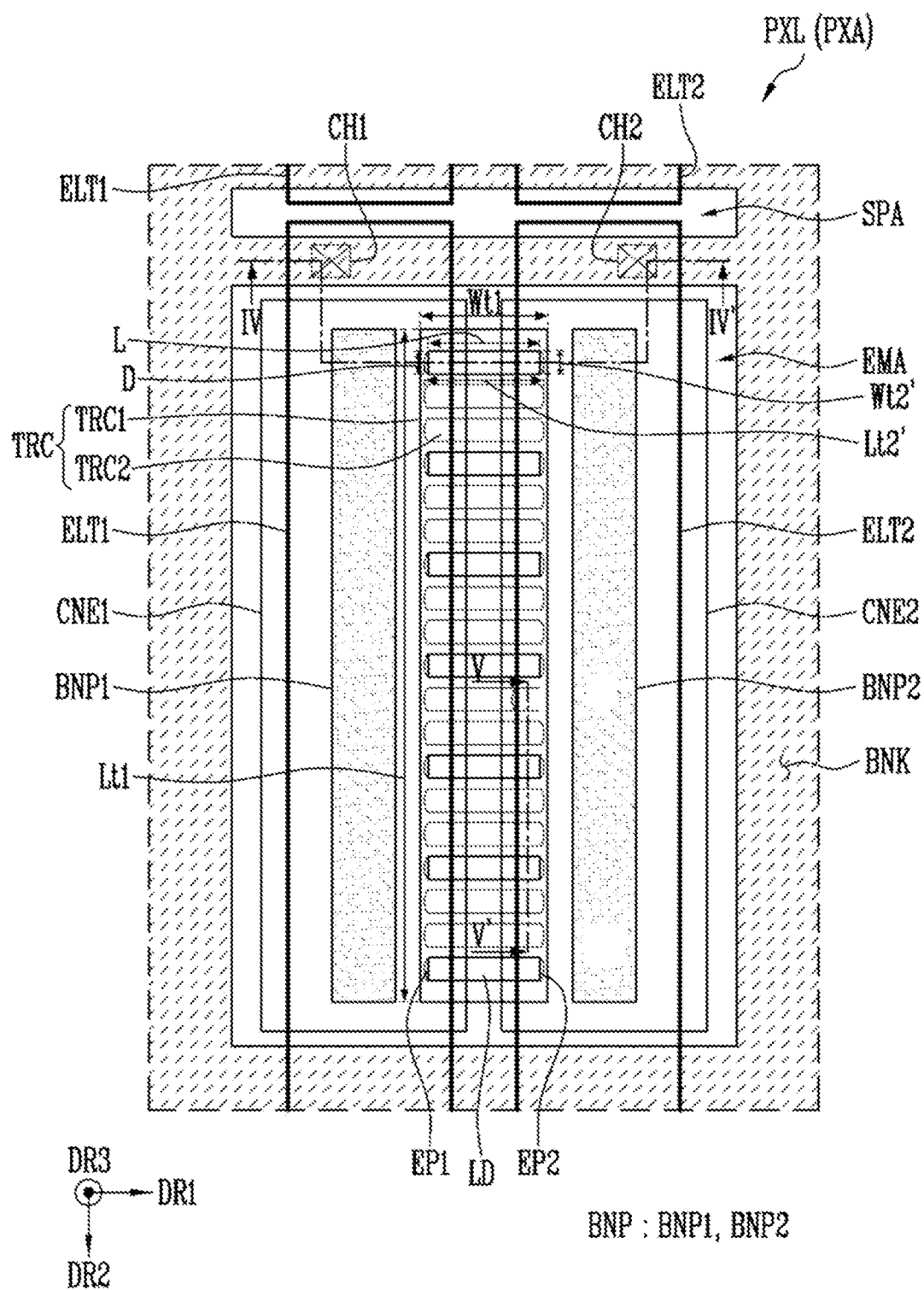
FIG. 9 is a schematic plan view illustrating the pixel according to an embodiment.
Figure 10:
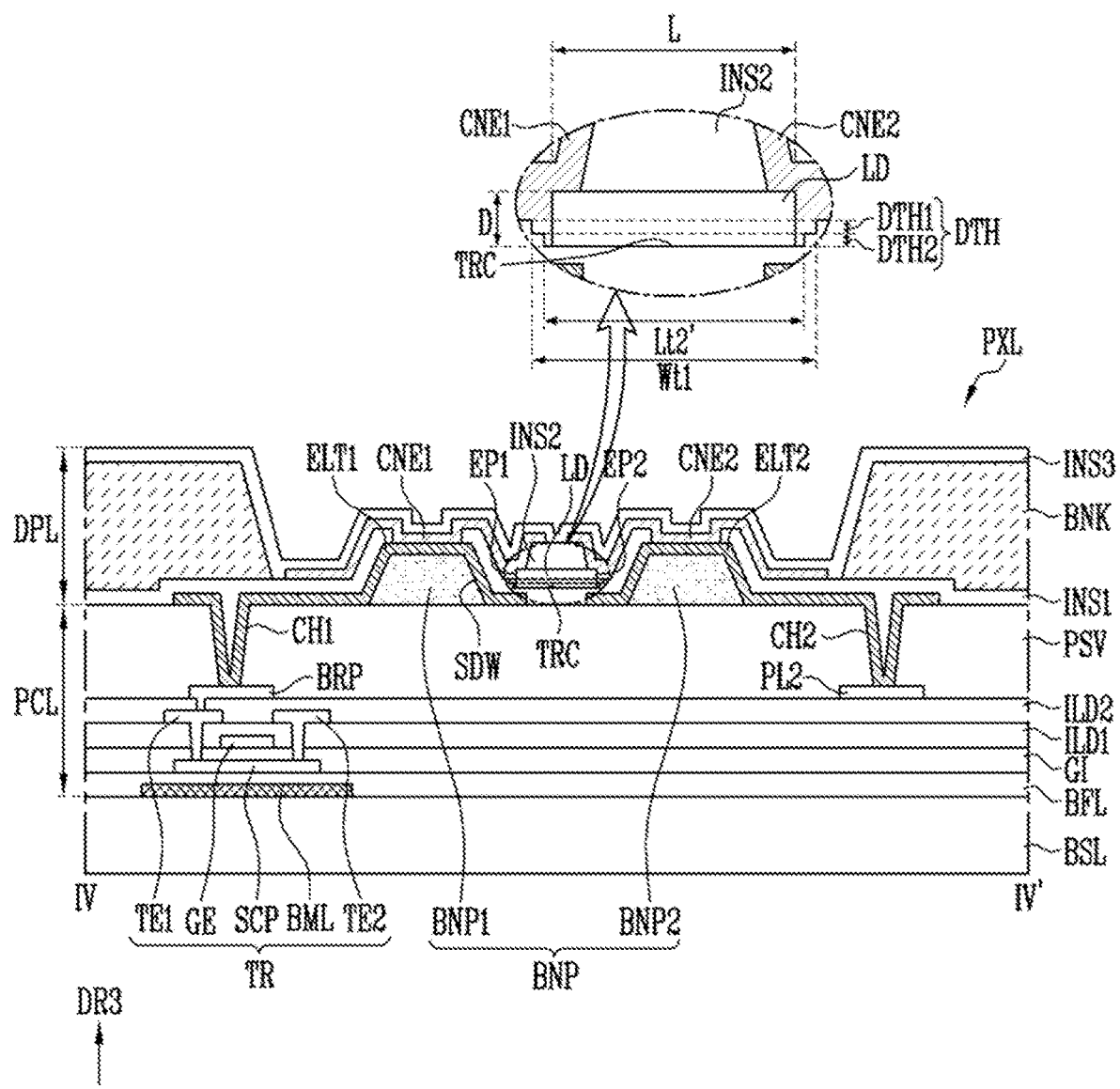
FIGS. 10 to 12 are schematic cross-sectional views illustrating the pixel according to an embodiment, respectively.
Figure 11:
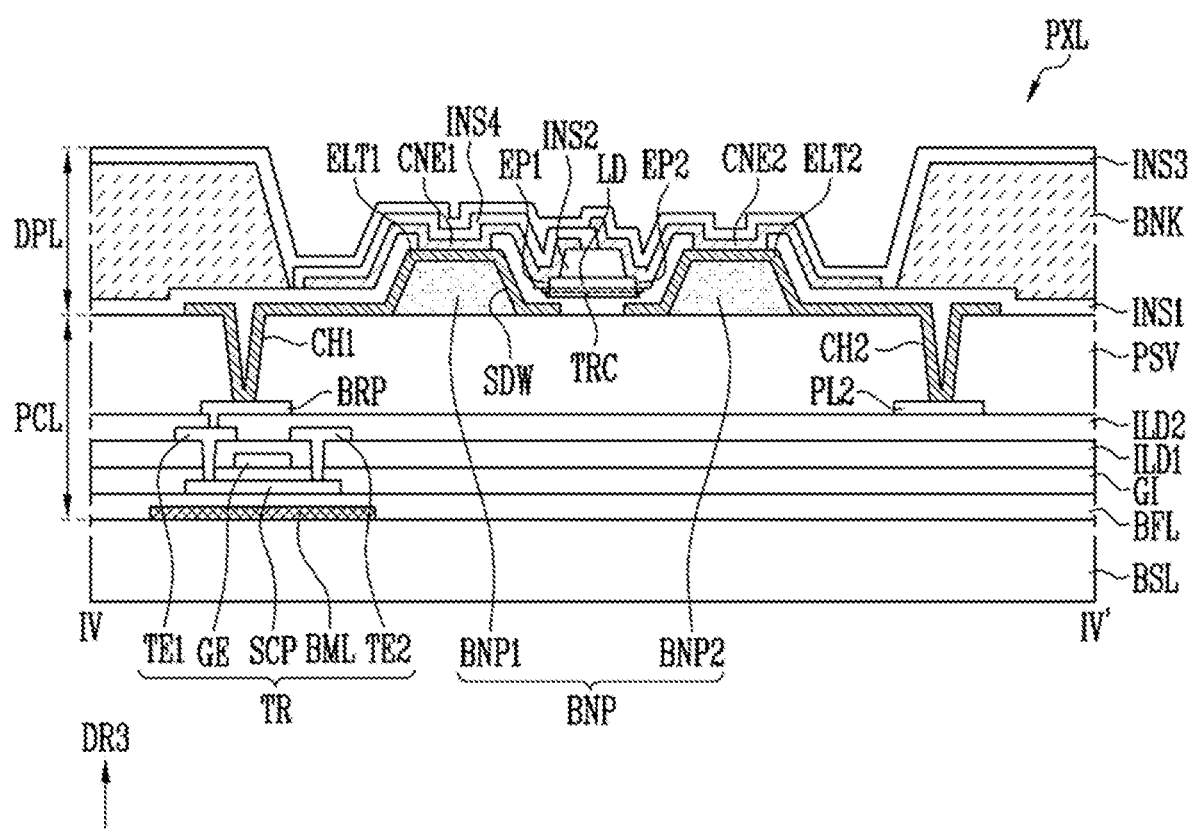
Figure 12:
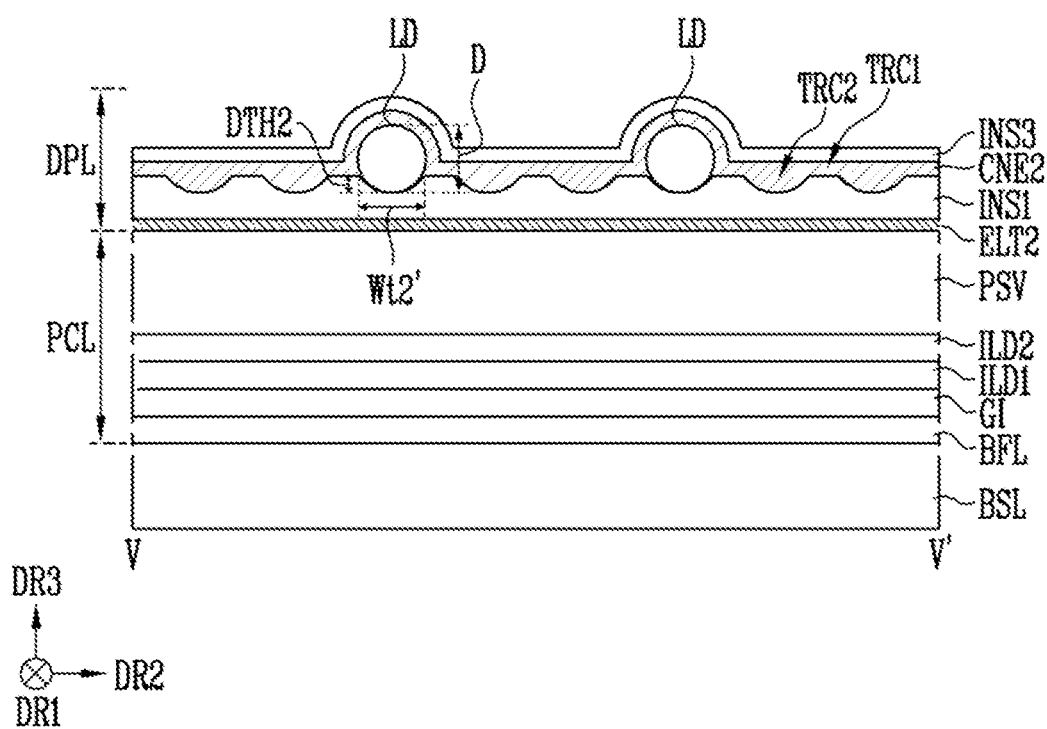

FIG. 9 is a schematic plan view illustrating the pixel PXL according to an embodiment. FIG. 9 illustrates a modification to FIG. 5. FIGS. 10 to 12 are schematic cross-sectional views illustrating the pixel PXL according to an embodiment, respectively. For example, FIGS. 10 and 11 illustrate different embodiments of the cross section of the pixel PXL taken along lines IV~IV' of FIG. 9. Compared to FIG. 10, FIG. 11 further includes a fourth insulating layer INS4 disposed on the first contact electrode CNE1. FIG. 12 illustrates an embodiment of the cross section of the pixel PXL taken along line V~V' of FIG. 9. In describing the embodiments of FIGS. 9 to 12, the same reference numerals are assigned to configurations similar to or identical to those of FIGS. 5 to 8.

Referring to FIGS. 9 to 12, each of the second trenches TRC2 may have a shape and an area capable of accommodating at least one light emitting element LD in a plan view. For example, the second trenches TRC2 may have a width Wt2' equal to or greater than the diameter D (or the width of the cross section) of the light emitting elements LD, and may have a length Lt2' equal to or greater than the length L of the light emitting elements LD. At least one of light emitting elements LD may be mounted and/or accommodated in at least one of the second trenches TRC2.

The trench TRC may have a width (for example, the width Wt1 of the first trench TRC1) capable of accommodating the light emitting elements LD as a whole by including the first and second trenches TRC1 and TRC2. The trench TRC may have a depth DTH capable of at least partially accommodating the light emitting elements LD. Accordingly, the light emitting elements LD may be stably arranged in the trench TRC.

Figure 13:
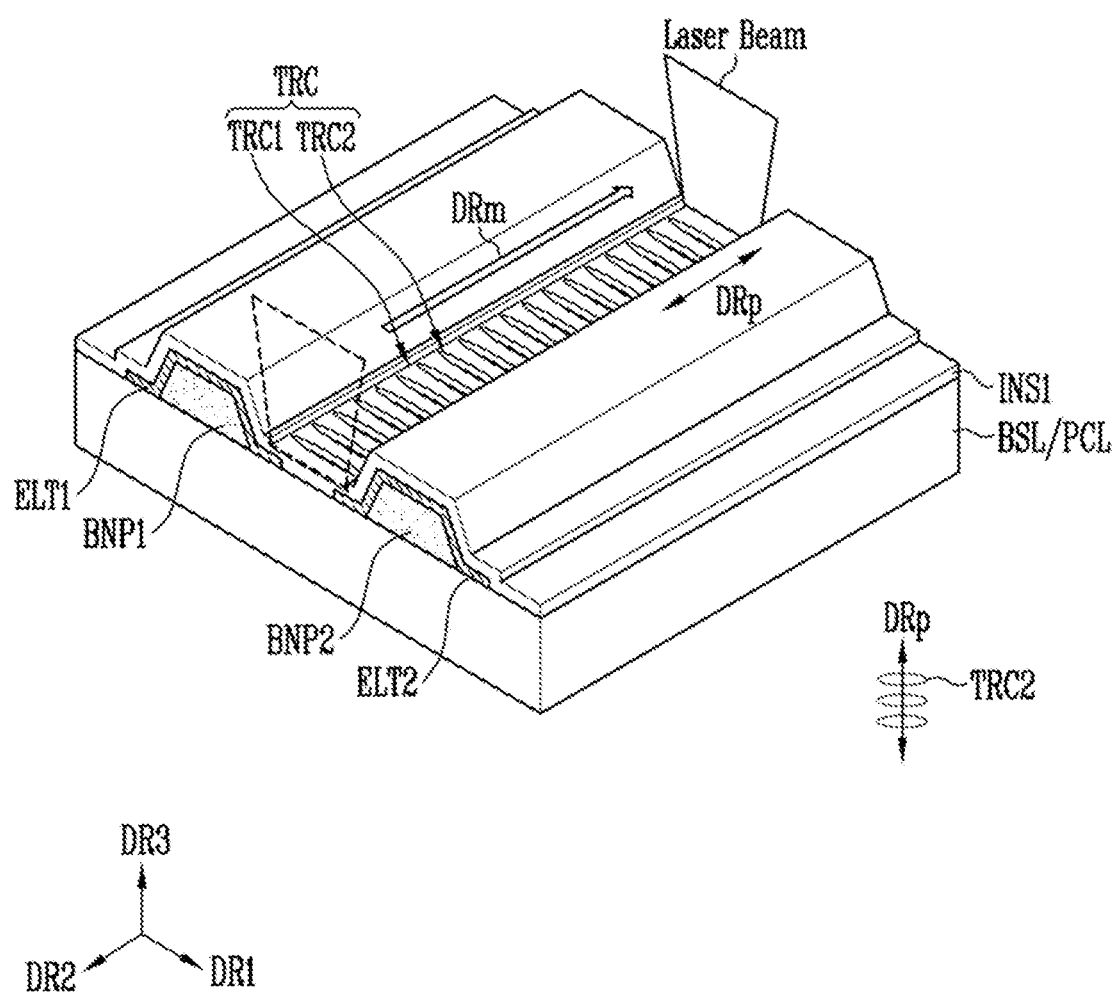
FIG. 13 is a schematic perspective view illustrating a trench and a method of forming the trench according to an embodiment.

FIG. 13 is a schematic perspective view schematically illustrating the trench TRC and a method of forming the trench TRC according to an embodiment. For example, FIG. 13 schematically illustrates a method of forming the trench TRC shown in FIGS. 5 and 9.

Referring to FIGS. 5 to 13, the trench TRC may be formed in the first insulating layer INS1 through an etching method using a laser beam. For example, the trench TRC of a desired size and/or shape may be formed at a desired position by adjusting a size, movement path and distance, intensity (power), a wavelength, a polarization direction, and/or the like of the laser beam.

The first trench TRC1 may have a shape and an area corresponding to the size, a movement direction DRm, and a movement distance of the laser beam. For example, the first trench TRC1 may have the width Wt1 corresponding to a length of the laser beam along the first direction DR1, and may have the shape and the length Lt1 corresponding to the movement path of the laser beam. The first trench TRC1 may have the depth DTH1 corresponding to the intensity of the laser beam. Therefore, the first trench TRC1 of a desired size and/or shape may be formed at a desired position by adjusting the size, the movement path and/or distance, the intensity, and/or the like of the laser beam.

The second trenches TRC2 may have a shape, a direction, a period (or interval), and a size corresponding to the polarization direction DRp, the wavelength, and the intensity of the laser beam. For example, each of the second trenches TRC2 may be generated and/or extended in a direction orthogonal to the polarization direction DRp of the laser beam, and may have a period corresponding to the wavelength of the laser beam. For example, when the polarization direction DRp of the laser beam is identical to (or is parallel to) the movement direction DRm, each of the second trenches TRC2 may be generated to be extended in the direction orthogonal to the movement direction DRm of the laser beam, and may be generated and/or arranged in a period corresponding to ¼ of the wavelength of the laser beam (or $\lambda/4$) along the movement direction DRm of the laser beam. The second trenches TRC2 may have the depth DTH2 corresponding to the intensity of the laser beam. Therefore, the second trenches TRC2 may be formed in the desired shape, direction, period, and/or size at the desired positions by adjusting the polarization direction DRp, wavelength, intensity, and the like of the laser beam.

In an embodiment, in order to form a double trench TRC of a nanometer scale to a micrometer scale size, an ultra-short wave laser such as a femtosecond laser (for example, a 290 fs laser) may be used. For example, the first and second trenches TRC1 and TRC2 may be formed using an ultra-short wave laser beam or an extremely ultra-short wave laser beam obtained by splitting the ultra-short wave laser beam. According to an embodiment, when the second trenches TRC2 are formed at a distance in the range of about 200 nm to about 300 nm (for example, approximately 250 nm), a laser beam of a wavelength of approximately 1030 nm may be used. In consideration of the shape, direction, size, and/or period of the trench TRC to be formed, the laser beam to be used to form the trench TRC may change.

Figure 14:
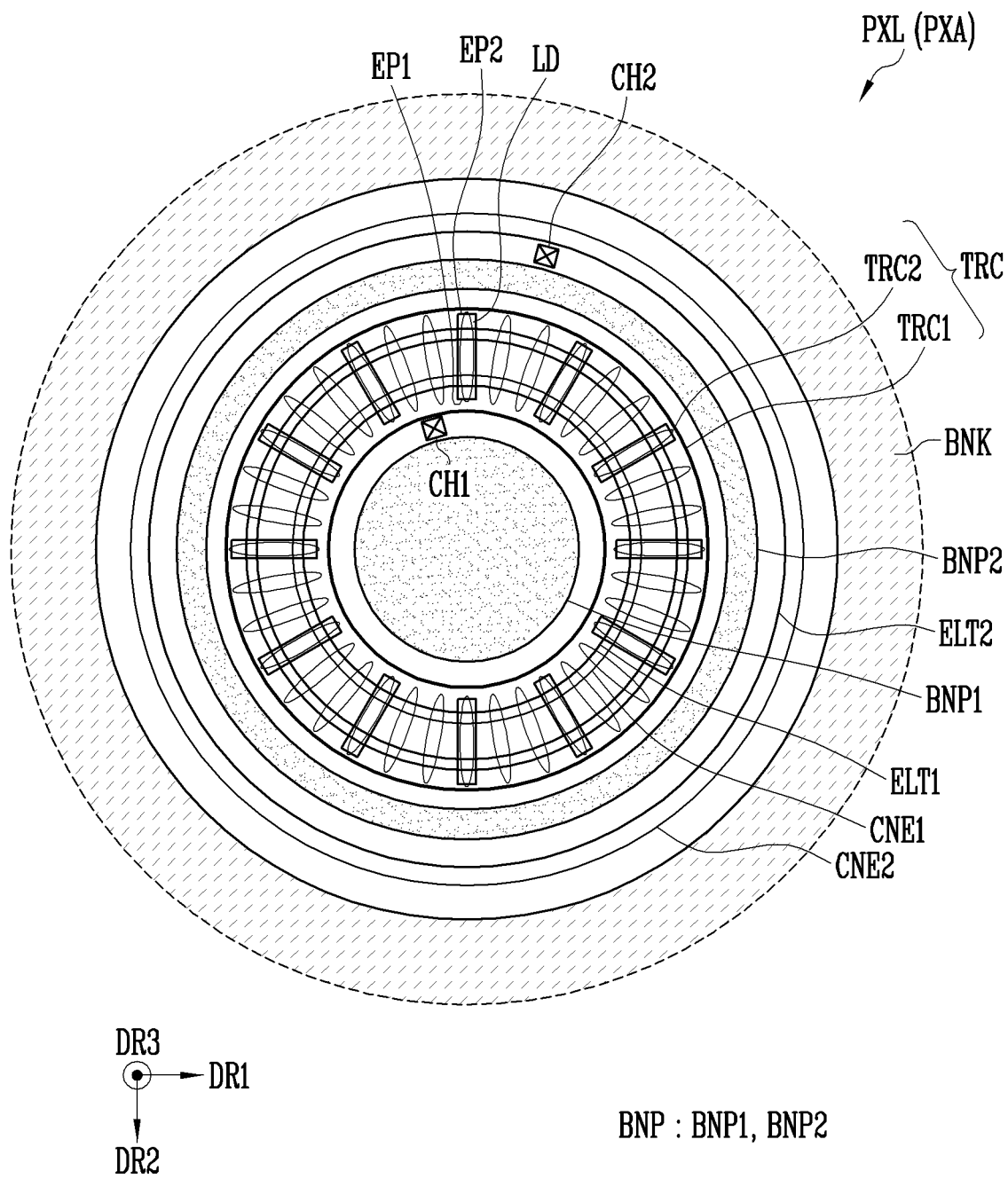
FIGS. 14 and 15 are schematic plan views illustrating the pixel according to an embodiment, respectively.
Figure 15:
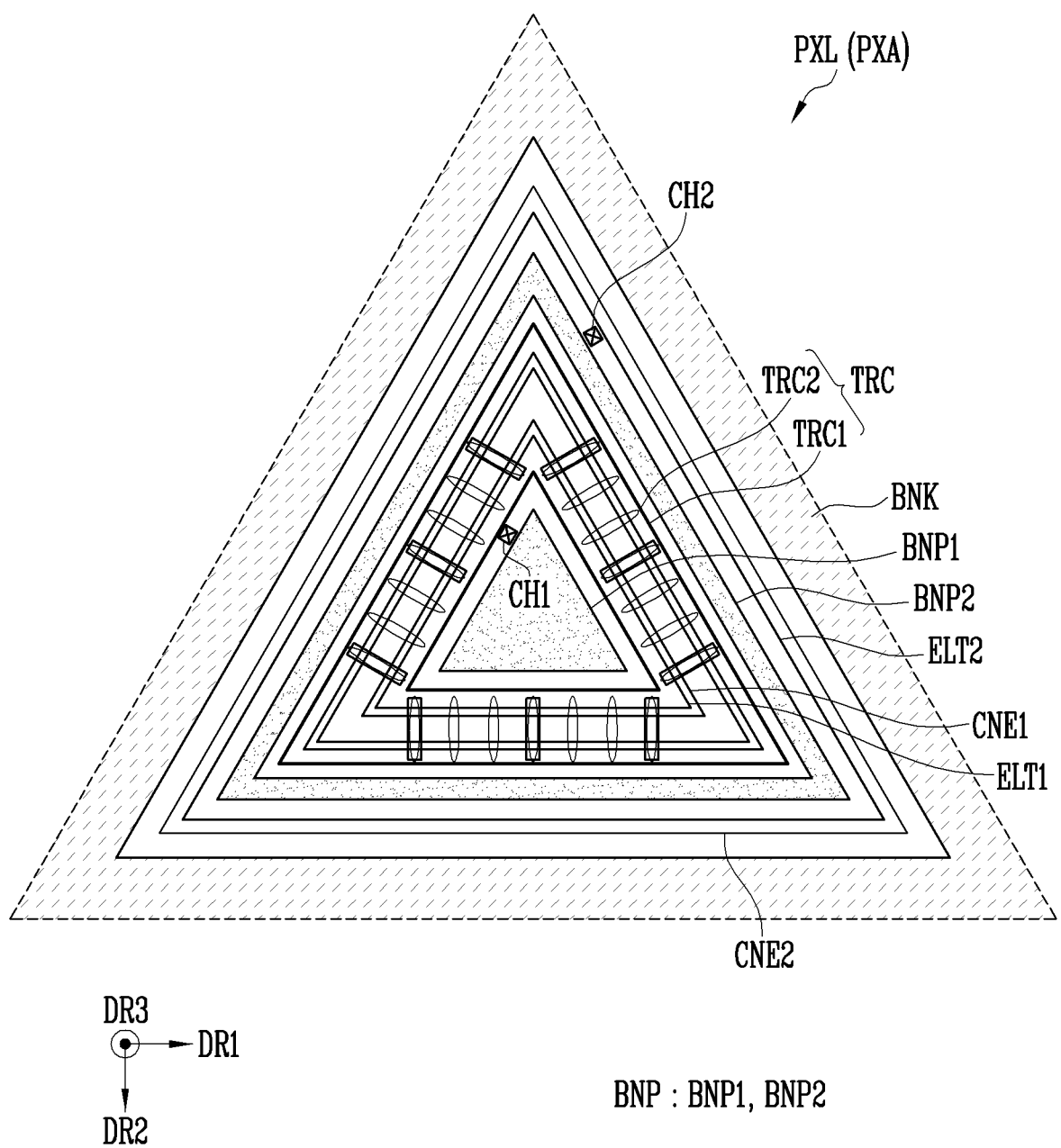

FIGS. 14 and 15 are schematic plan views illustrating pixels PXL according to the embodiments. FIGS. 14 and 15 illustrate modifications to FIG. 5.

Referring to FIGS. 14 and 15, the shape, position, size, structure, and/or the like of the first and second electrodes ELT1 and ELT2 may be changed in the embodiments. The shape, position, size, and/or the like of the bank pattern BNP, the trench TRC, the first and second contact electrodes CNE1 and CNE2, and/or the bank BNK may also be changed according to the shape, position, size, structure, and/or the like of the first and second electrodes ELT1 and ELT2.

For example, in the embodiment of FIG. 14, the first electrode ELT1 may have a circular (or elliptical) shape, and the second electrode ELT2 may have a circular (or elliptical) ring shape concentric with the first electrode ELT1 and surrounding the first electrode ELT1. The trench TRC may have a circular (or elliptical) ring shape concentric with the first and second electrodes ELT1 and ELT2, and may or may not partially overlap the first electrode ELT1 and/or the second electrode ELT2. Similarly, the bank pattern BNP and the first and second contact electrodes CNE1 and CNE2 may have a circular (or elliptical) shape conforming to the shape of the first and second electrodes ELT1 and ELT2, or may have a ring shape corresponding thereto.

In the embodiment of FIG. 15, the first electrode ELT1 may have a polygonal shape (for example, a triangle), and the second electrode ELT2 may have a polygonal (for example, a triangular) ring shape concentric with the first electrode ELT1 and surrounding the first electrode ELT1. The trench TRC may have a polygonal (for example, triangular) ring shape concentric with the first and second electrodes ELT1 and ELT2, and may or may not partially overlap the first electrode ELT1 and/or the second electrode ELT2. Similarly, the bank pattern BNP and the first and second contact electrodes CNE1 and CNE2 may also have a polygonal shape (for example, a triangle) conforming to the shape of the first and second electrodes ELT1 and ELT2, or may have a ring shape corresponding thereto.

The bank BNK may have a shape conforming to the shape of the first and second electrodes ELT1 and ELT2, or may have an opening corresponding to a predetermined light emitting area EMA regardless of the shape of the first and second electrodes ELT1 and ELT2. For example, the bank BNK may have a circular (or elliptical) or polygonal (for example, triangular) opening conforming to the shape of the first and second electrodes ELT1 and ELT2, but the embodiments are not limited thereto.

Figure 16:
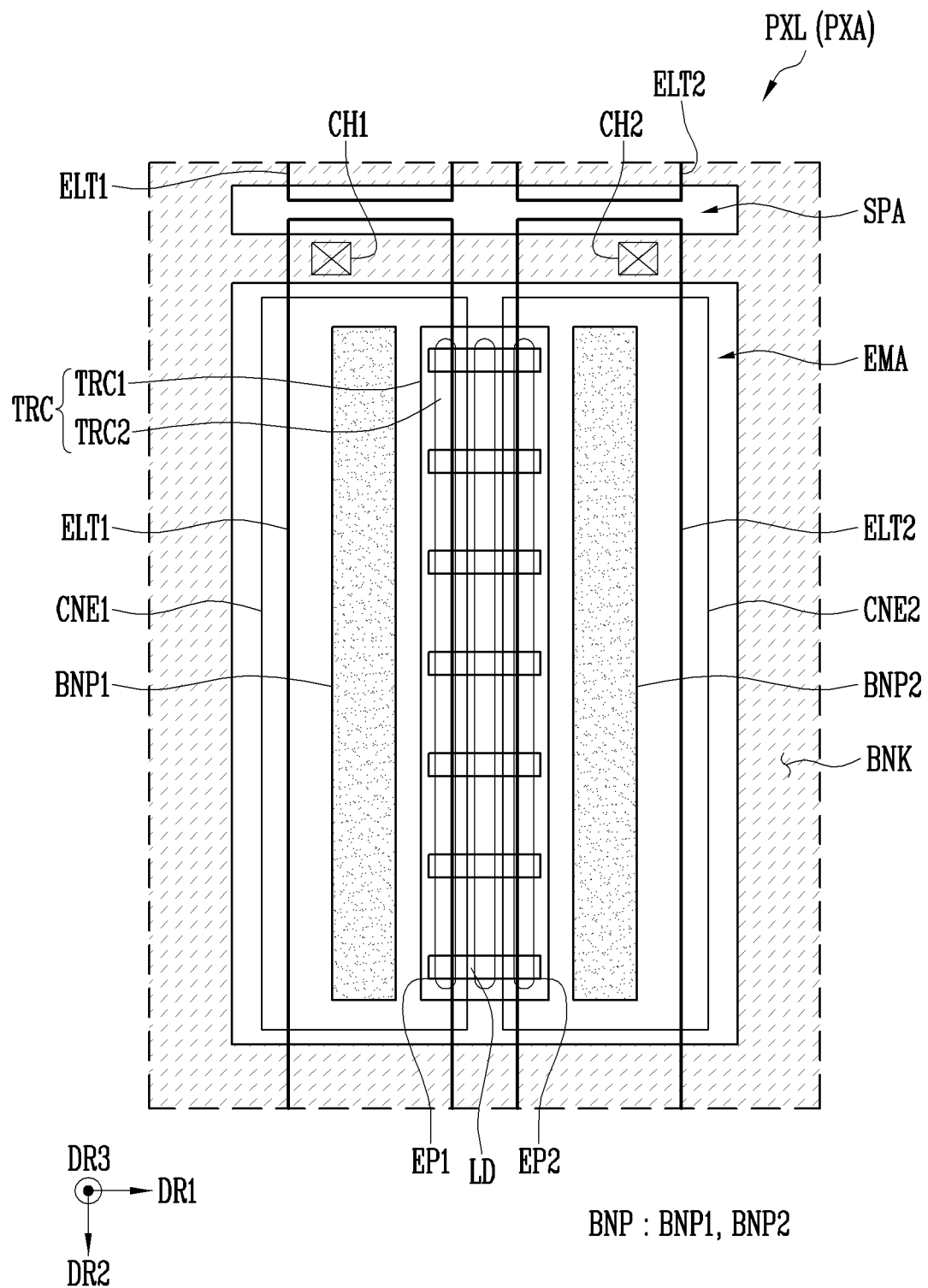
FIG. 16 is a schematic plan view illustrating the pixel according to an embodiment.
Figure 17:
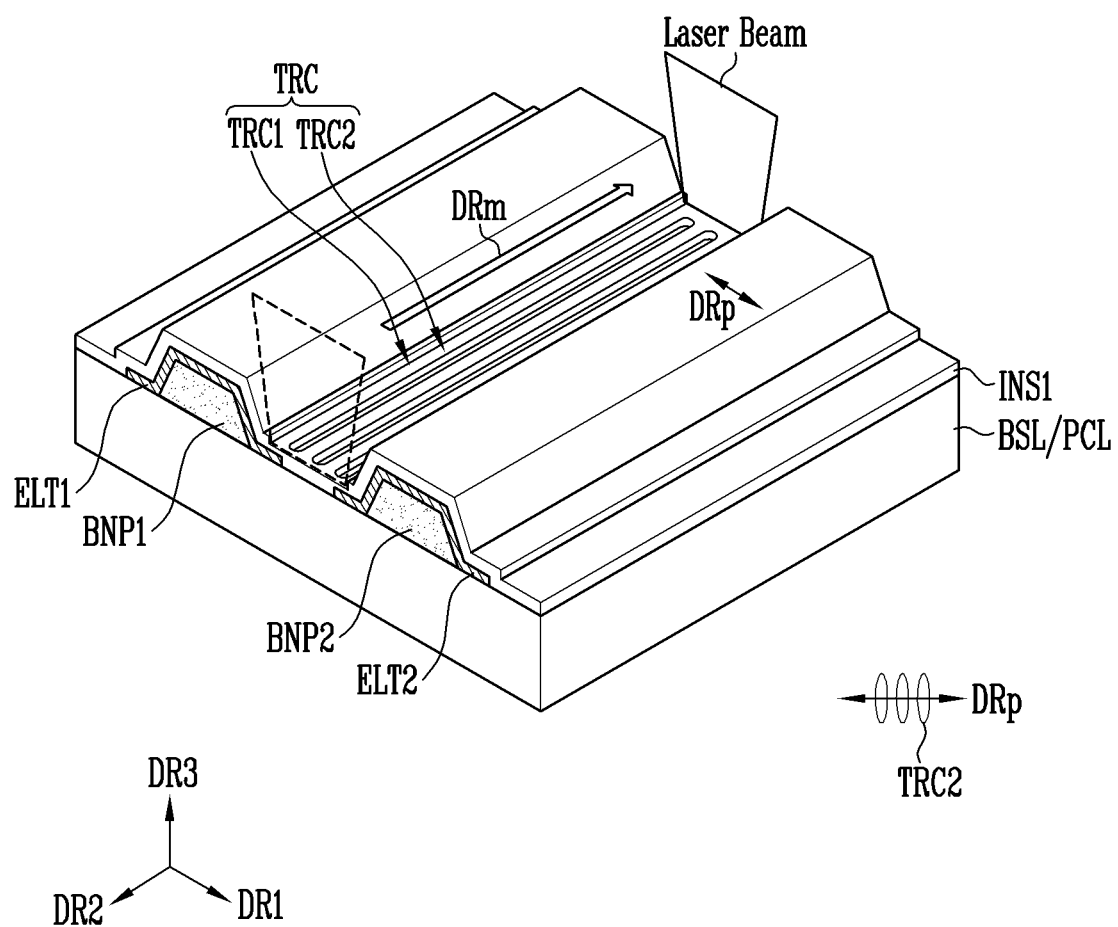
FIG. 17 is a schematic perspective view schematically illustrating the trench and a method of forming the trench according to an embodiment.

FIG. 16 is a schematic plan view illustrating the pixel PXL according to an embodiment. FIG. 16 illustrates a modification to FIG. 5. FIG. 17 is a schematic perspective view illustrating the trench TRC and a method of forming the trench TRC according to an embodiment. FIG. 17 schematically illustrates a method of forming the trench TRC shown in FIG. 16.

Referring to FIGS. 16 and 17, each of the second trenches TRC2 may extend vertically in the second direction DR2 and may be sequentially arranged along, or disposed in, the first direction DR1. For example, a formation direction of the second trenches TRC2 may be changed by changing the polarization direction DRp of the laser beam to the first direction DR1 crossing, or intersecting, the movement direction DRm of the laser beam, for example, in an orthogonal direction to the movement direction DRm. For example, each of the second trenches TRC2 may extend in a direction substantially parallel to the extension direction of the first trench TRC1.

However, the embodiments are not limited by the formation direction of the second trenches TRC2. For example, the second trenches TRC2 may be formed in a diagonal direction or the like crossing, or intersecting, the first and second directions DR1 and DR2.

In the above-described embodiment, the uneven surface may be formed in the first trench TRC1 by the second trenches TRC2. Accordingly, the alignment of the light emitting elements LD may be improved.

Figure 18:
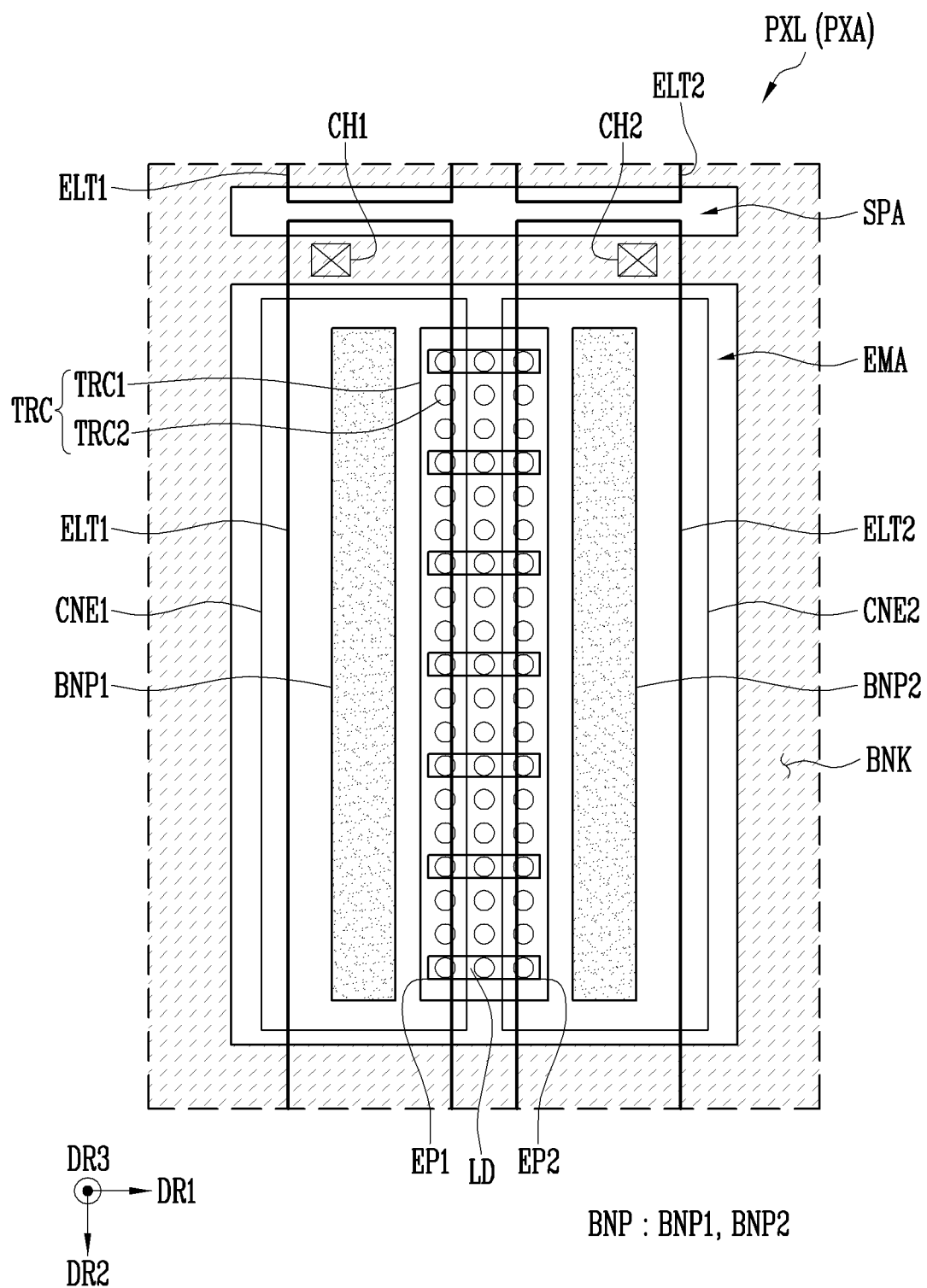
FIG. 18 is a schematic plan view illustrating the pixel according to an embodiment.
Figure 19:
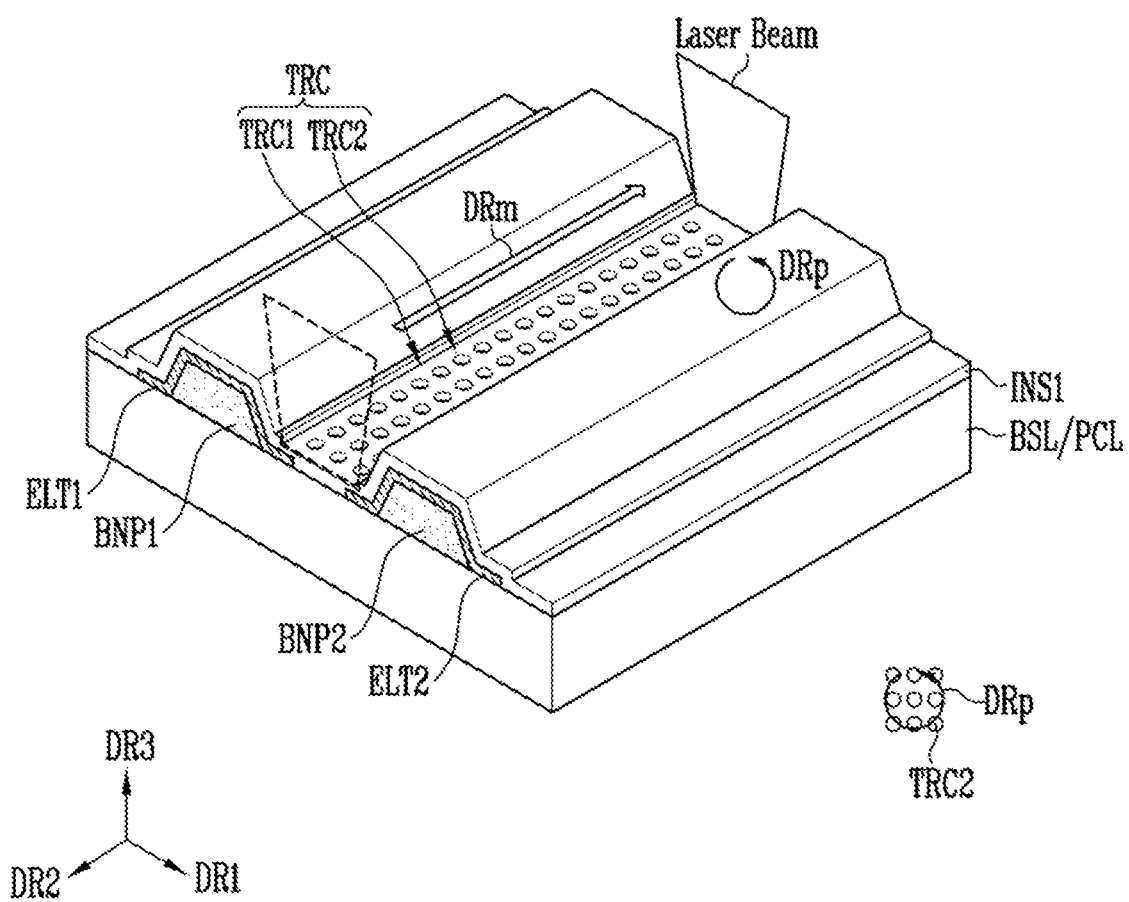
FIG. 19 is a schematic perspective view illustrating the trench and a method of forming the trench according to an embodiment.
Figure 20:
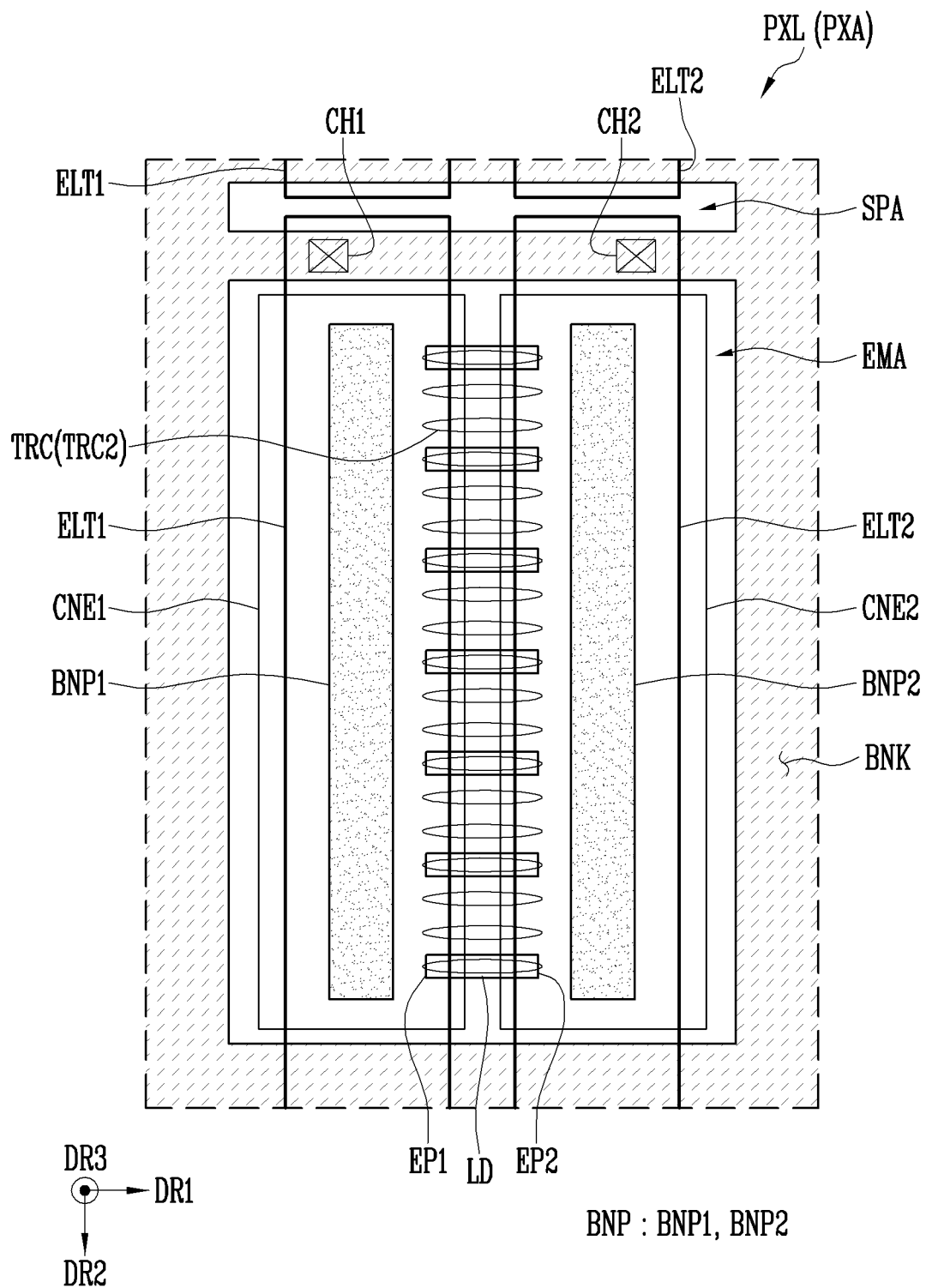
FIGS. 20 to 25 are schematic plan views illustrating the pixel according to an embodiment.
Figure 21:
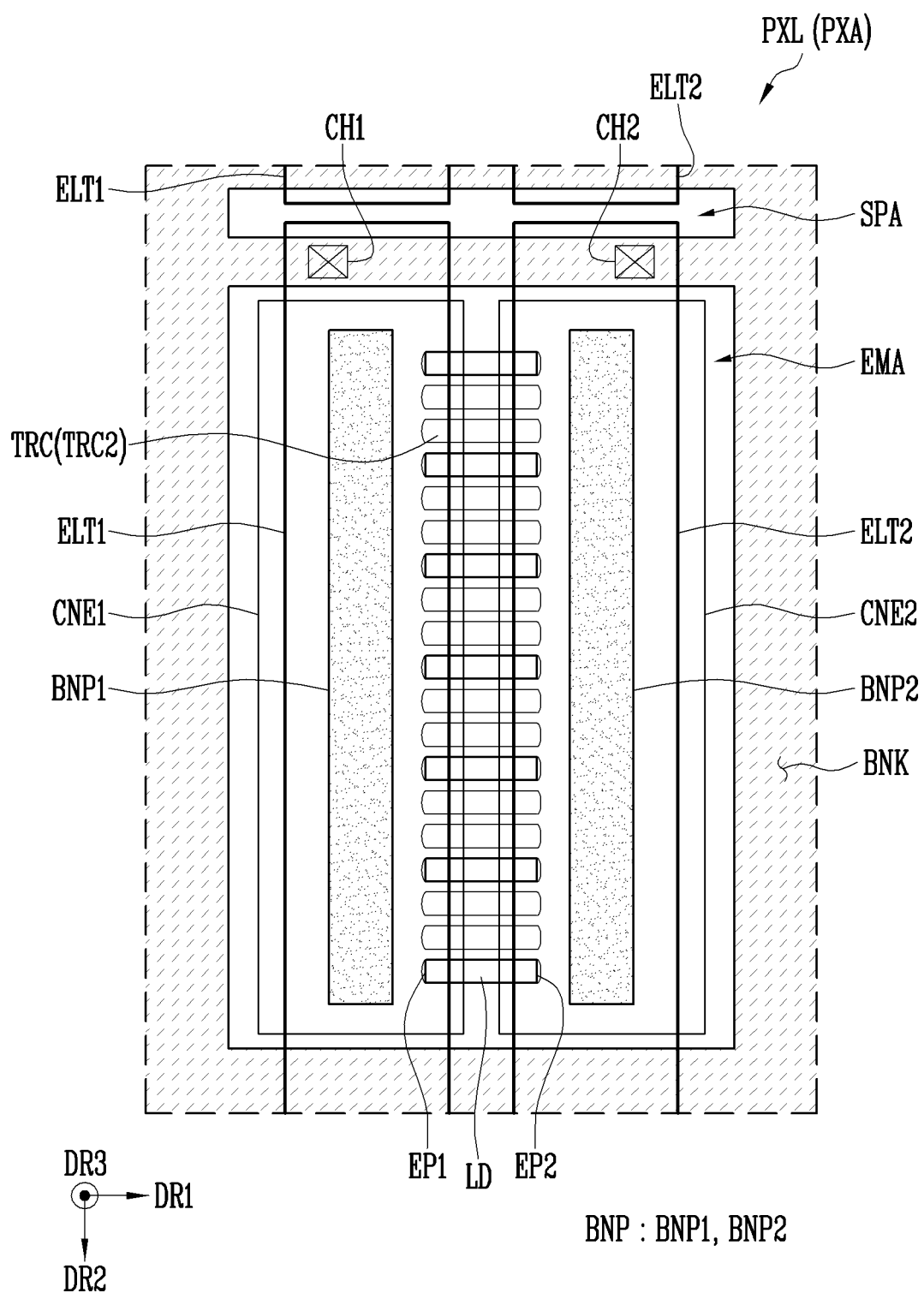
Figure 22:
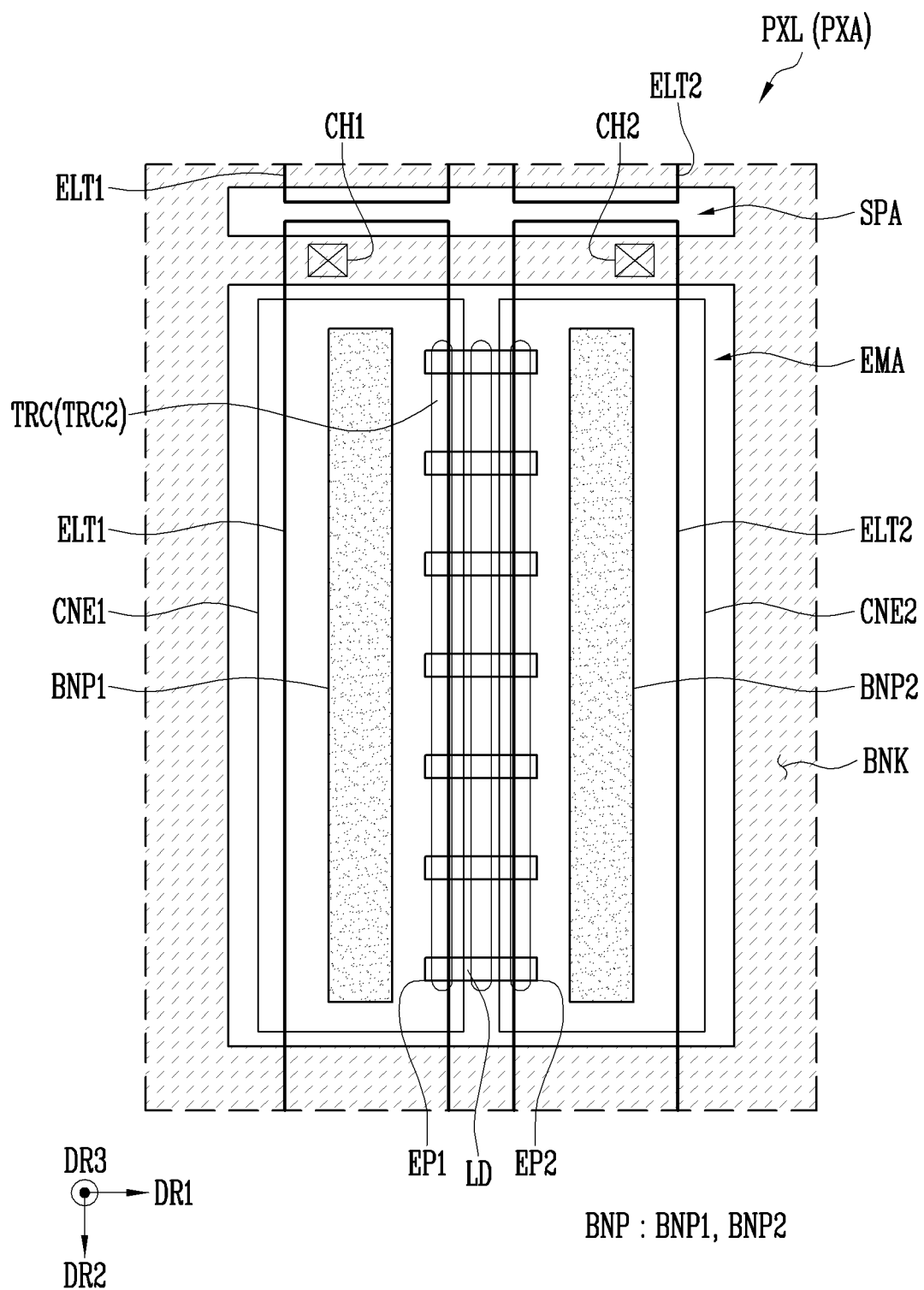
Figure 23:
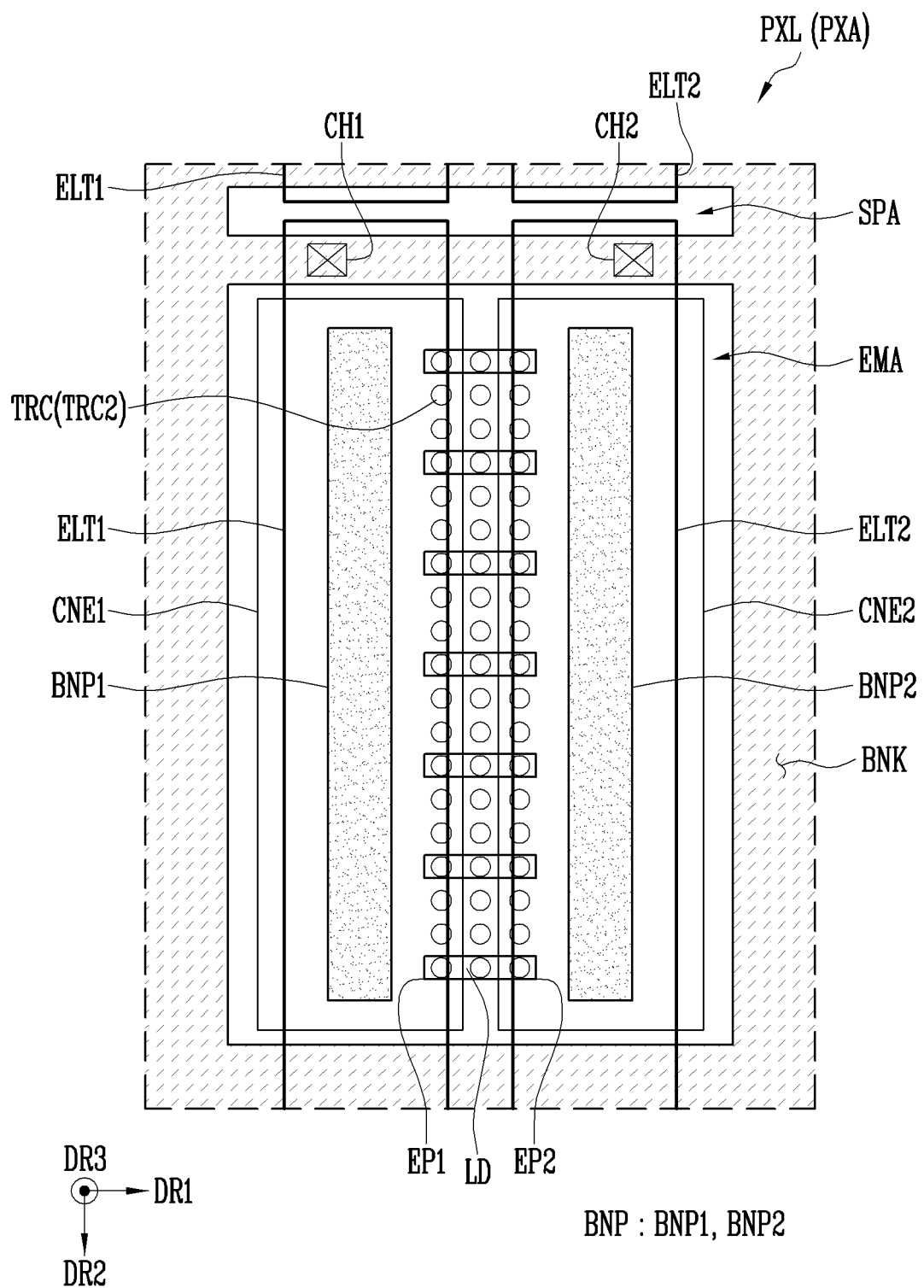

FIG. 18 is a schematic plan view illustrating a pixel PXL according to an embodiment. For example, FIG. 18 illustrates modifications to FIGS. 5 and 16. FIG. 19 is a schematic perspective view illustrating the trench TRC and a method of forming the trench TRC according to an embodiment. FIG. 19 schematically illustrates a method of forming the trench TRC shown in FIG. 18.

Referring to FIGS. 18 and 19, each of the second trenches TRC2 may have a dot shape (for example, a circular or elliptical shape) and may be dispersed in the first trench TRC1. The second trenches TRC2 of the dot shape may be formed on the bottom surface of the first trench TRC1 by changing the polarization direction DRp of the laser beam to a circular shape.

In an embodiment, the second trenches TRC2 may be distributed in a matrix form on the bottom surface of the first trench TRC1 along the first and second directions DR1 and DR2. However, the embodiments are not limited thereto. For example, in another embodiment, the second trenches TRC2 may be irregularly distributed inside the first trench TRC1.

In the embodiments, the uneven surface may be formed in the first trench TRC1 by the second trenches TRC2. Accordingly, the alignment degree of the light emitting elements LD may be improved.

Figure 24:
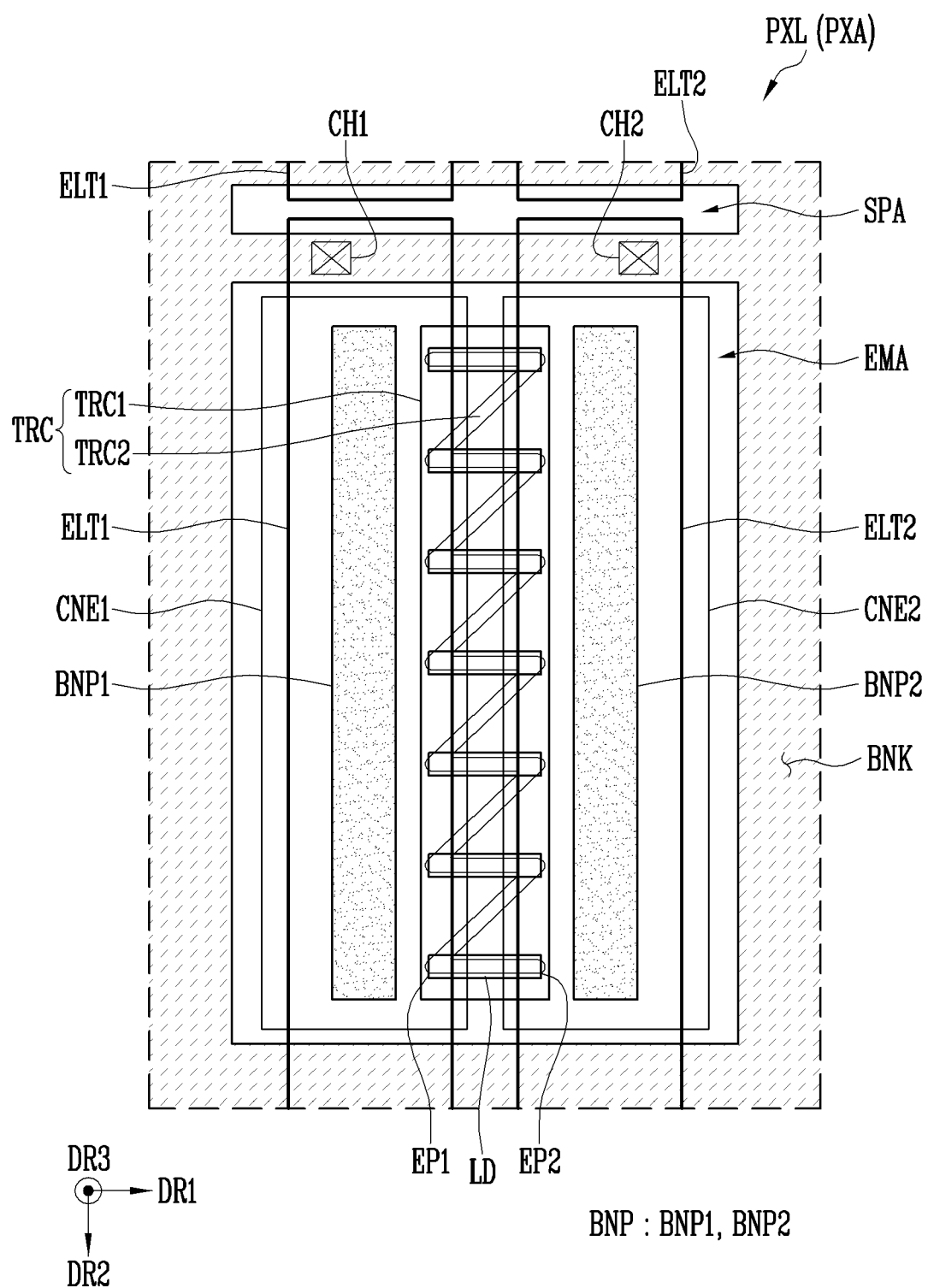
Figure 25:
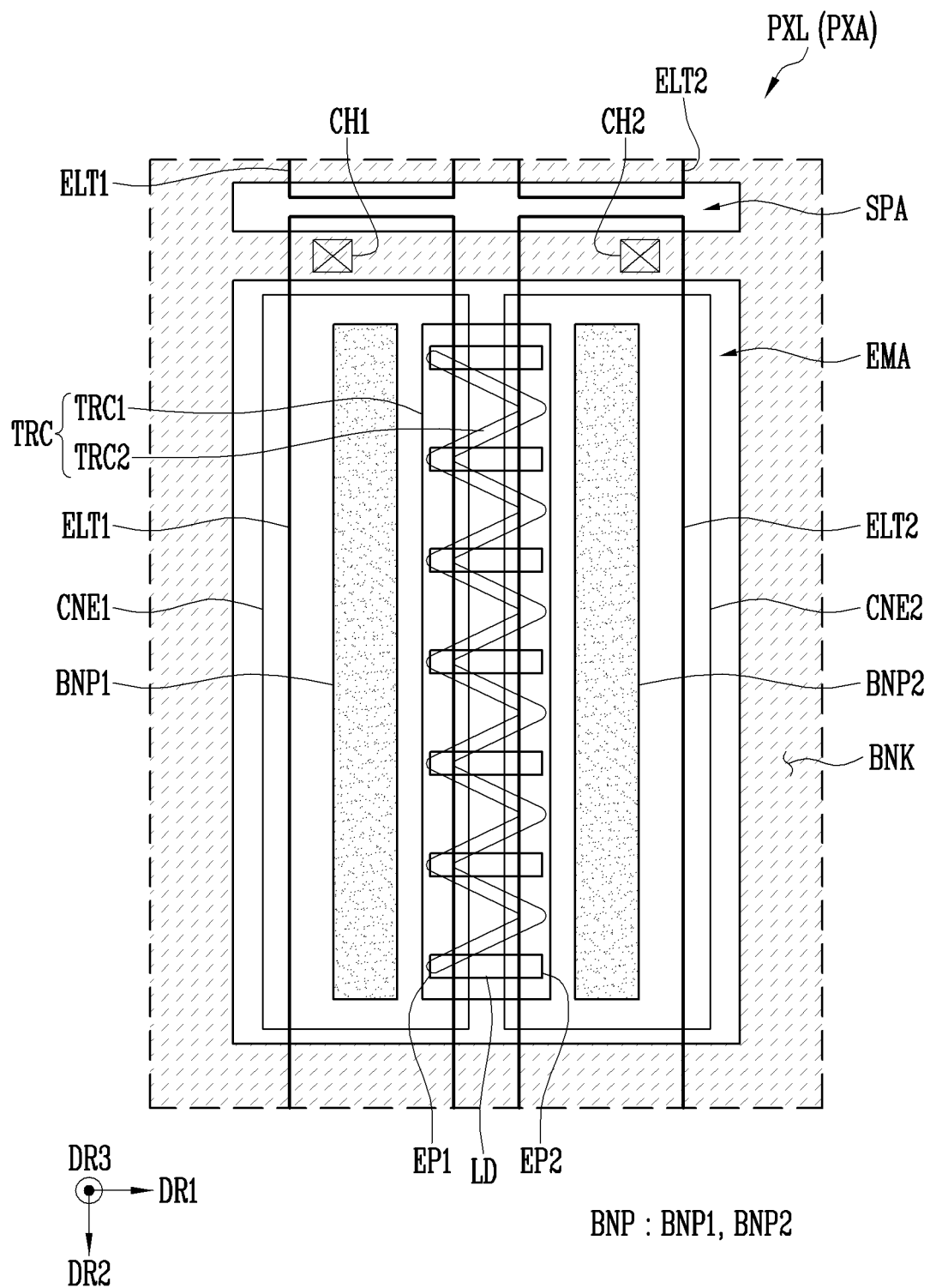

FIGS. 20 to 25 are schematic plan views illustrating the pixel PXL according to the embodiments. For example, FIGS. 20 to 23 illustrate modifications of FIGS. 5, 9, 16, and 18, respectively, and FIGS. 24 and 25 illustrate different modifications of FIG. 5.

Referring to FIGS. 20 to 23, the trench TRC may not include the first trench TRC1 and may only include the second trenches TRC2.

Referring to FIGS. 24 and 25, at least some of the second trenches TRC2 disclosed in the above-described embodiments may be integrally connected to form one second trench TRC2. For example, a second trench TRC2 of a zigzag shape may be formed by periodically changing the movement direction of the laser beam while moving the laser beam in a diagonal direction with respect to at least one of the first direction DR1 and the second direction DR2. Continuous laser processing may be possible, and thus process efficiency may be improved.

In the embodiments of FIGS. 24 and 25, the first trench TRC1 may be selectively formed. For example, the trench TRC may include the first and second trenches TRC1 and TRC2 shown in FIGS. 24 and 25. In other embodiments, the trench TRC may not include the first trench TRC1 and may include only the second trench TRC2.

As described above, the structure and/or shape of the trench TRC may be changed according to an embodiment.

Although the technical spirit has been described in detail in accordance with the above-described embodiments, it should be noted that the above-described embodiments are for the purpose of description and not of limitation. Those skilled in the art may understand that various modifications are possible within the scope of the technical spirit of the embodiments.

The scope of the embodiments are not limited to the details described in the detailed description of the specification, but should be defined by the claims. It is to be construed that all changes or modifications derived from the meaning and scope of the claims and equivalent concepts thereof are included in the scope.

What is claimed is:

1. A display device comprising:
    a pixel disposed in a display area, the pixel comprising:
        a first electrode and a second electrode that are spaced apart from each other;
        a first insulating layer disposed on the first electrode and the second electrode and including a trench corresponding to a region between the first electrode and the second electrode;
        light emitting elements disposed in the trench, each of the light emitting elements including a first end portion and a second end portion;
        a first contact electrode disposed on the first end portion of each of the light emitting elements and the first electrode; and
        a second contact electrode disposed on the second end portion of each of the light emitting elements and the second electrode,
    wherein the trench comprises:
        a first trench that accommodates the light emitting elements; and
        second trenches disposed in the first trench.

2. The display device according to claim 1, wherein the second trenches are disposed on a bottom surface of the first trench to form an uneven surface on the bottom surface of the first trench.

3. The display device according to claim 1, wherein
    the first electrode, the first trench, and the second electrode are sequentially disposed in a first direction, and
    each of the first electrode, the first trench, and the second electrode extends in a second direction intersecting the first direction.

4. The display device according to claim 3, wherein the first trench has a width equal to or greater than a length of each of the light emitting elements in the first direction.

5. The display device according to claim 4, wherein each of the second trenches extends in the first direction, and
    the second trenches are sequentially disposed in the second direction.

6. The display device according to claim 5, wherein each of the second trenches has a length equal to or greater than the length of each of the light emitting elements in the first direction.

7. The display device according to claim 6, wherein
    each of the second trenches has a width equal to or less than a diameter of each of the light emitting elements in the second direction, and
    at least one of the light emitting elements is partially inserted in at least one of the second trenches.

8. The display device according to claim 6, wherein
    each of the second trenches has a width equal to or greater than a diameter of each of the light emitting elements in the second direction, and
    at least one of the light emitting elements is accommodated in at least one of the second trenches.

9. The display device according to claim 4, wherein
    each of the second trenches extends in the second direction, and
    the second trenches are sequentially disposed in the first direction.

10. The display device according to claim 1, wherein
    each of the second trenches has a dot shape, and
    the second trenches are dispersed on a bottom surface of the first trench.

11. The display device according to claim 1, wherein each of the second trenches has a depth equal to or less than a diameter of each of the light emitting elements.

12. The display device according to claim 1, wherein
    the first electrode has a circular or polygonal shape, and
    the second electrode and the trench have a circular ring or polygonal ring shape concentric with the first electrode.

13. The display device according to claim 1, wherein
    the first contact electrode electrically connects the first end portion of each of the light emitting elements to the first electrode, and
    the second contact electrode electrically connects the second end portion of each of the light emitting elements to the second electrode.

14. The display device according to claim 1, wherein the pixel further comprises:
    a first bank pattern portion disposed under the first electrode and overlapping a region of the first electrode; and
    a second bank pattern portion disposed under the second electrode and overlapping a region of the second electrode.

15. The display device according to claim 14, wherein the trench is disposed in a region between the first bank pattern portion and the second bank pattern portion and does not overlap the first bank pattern portion and the second bank pattern portion.

16. A pixel comprising:
    a first electrode and a second electrode that are spaced apart from each other;
    a first insulating layer disposed on the first electrode and the second electrode and including a trench corresponding to a region between the first electrode and the second electrode;
    light emitting elements disposed in the trench, each of the light emitting elements including a first end portion and a second end portion;
    a first contact electrode disposed on the first end portion of each of the light emitting elements and the first electrode; and a second contact electrode disposed on the second end portion of each of the light emitting elements and the second electrode, wherein the trench comprises:
- a first trench that accommodates the light emitting elements; and
- second trenches disposed in the first trench.

17. The pixel according to claim 16, wherein the second trenches are disposed on a bottom surface of the first trench to form an uneven surface on the bottom surface of the first trench.

18. The pixel according to claim 16, wherein each of the second trenches has a depth equal to or less than a diameter of each of the light emitting elements.

19. The pixel according to claim 16, further comprising:
- a first bank pattern portion disposed under the first electrode and overlapping a region of the first electrode; and
- a second bank pattern portion disposed under the second electrode and overlapping a region of the second electrode.

20. The pixel according to claim 19, wherein the trench is disposed in a region between the first bank pattern portion and the second bank pattern portion and does not overlap the first bank pattern portion and the second bank pattern portion.

* * * * *